(12) United States Patent
Shibayama

(10) Patent No.: US 8,564,336 B2
(45) Date of Patent: *Oct. 22, 2013

(54) CLOCK FREQUENCY DIVIDER CIRCUIT AND CLOCK FREQUENCY DIVISION METHOD

(75) Inventor: Atsufumi Shibayama, Tokyo (JP)

(73) Assignee: NEC Corporation, Tokyo (JP)

(\*) Notice: Subject to any disclaimer, the term of this patent is extended or adjusted under 35 U.S.C. 154(b) by 19 days.

This patent is subject to a terminal disclaimer.

(21) Appl. No.: 13/058,466

(22) PCT Filed: Jul. 30, 2009

(86) PCT No.: PCT/JP2009/003633
§ 371 (c)(1),
(2), (4) Date: Feb. 10, 2011

(87) PCT Pub. No.: WO2010/050098
PCT Pub. Date: May 6, 2010

(65) Prior Publication Data
US 2011/0193596 A1 Aug. 11, 2011

(30) Foreign Application Priority Data
Oct. 29, 2008 (JP) ................................. 2008-278498

(51) Int. Cl.
*H03B 19/00* (2006.01)

(52) U.S. Cl.
USPC .............................. 327/117; 327/115; 377/48

(58) Field of Classification Search
USPC ......................... 327/115, 117, 118; 377/47, 48
See application file for complete search history.

(56) References Cited

U.S. PATENT DOCUMENTS

| 8,253,450 B2* | 8/2012 | Shibayama ................... 327/115 |
| 2011/0200162 A1* | 8/2011 | Shibayama ..................... 377/48 |
| 2011/0222644 A1* | 9/2011 | Shibayama ..................... 377/48 |

FOREIGN PATENT DOCUMENTS

| JP | 63-151217 A | 6/1988 |
| JP | 5-160721 A | 6/1993 |
| JP | 9-046222 A | 2/1997 |
| JP | 2000-035832 A | 2/2000 |
| JP | 2001127618 A | 5/2001 |
| JP | 2001-320022 A | 11/2001 |

(Continued)

OTHER PUBLICATIONS

International Search Report for PCT/JP2009/003633 mailed Aug. 25, 2009.

(Continued)

*Primary Examiner* — Lincoln Donovan
*Assistant Examiner* — William Hernandez

(57) ABSTRACT

A clock frequency divider circuit 11 according to the present invention generates an output clock signal obtained by dividing a frequency of an input clock signal into N/S by masking (S-N) clock pulses from S clock pulses of the input clock signal based on a frequency division ratio defined as N/S. The clock frequency divider circuit 11 includes a mask control circuit that generates a mask signal in which a non-mask timing is preferentially assigned to a clock pulse at a timing at which no clock pulse exists in a clock signal used in a circuit Ai other than a target circuit Bi using the output clock signal among S clock pulses of the input clock signal, and a mask circuit that generates the output clock signal by masking a clock pulse of the input clock signal according to the mask signal generated by the mask control circuit.

10 Claims, 16 Drawing Sheets

(56) References Cited

FOREIGN PATENT DOCUMENTS

| | | |
|---|---|---|
| JP | 2005045507 A | 2/2005 |
| JP | 2006148807 A | 6/2006 |
| JP | 2006245631 A | 9/2006 |

OTHER PUBLICATIONS

Japanese Office Action for JP Application No. 2010-535622 mailed on May 14, 2013 with English Translation.

* cited by examiner

CLOCK FREQUENCY DIVIDER CIRCUIT AND CLOCK FREQUENCY DIVISION METHOD

This application is the National Phase of PCT/JP2009/003633, filed Jul. 30, 2009, which is based upon and claims the benefit of priority from Japanese patent application No. 2008-278498, filed on Oct. 29, 2008, the disclosure of which is incorporated herein in its entirety by reference.

TECHNICAL FIELD

The present invention relates to a clock frequency divider circuit, a clock distribution circuit, a clock frequency division method, and a clock distribution method. In particular, the present invention relates to a clock frequency divider circuit, a clock distribution circuit, a clock frequency division method, and a clock distribution method to generate clock signals having different frequencies and distribute generated clock signals having different frequencies to respective functional blocks.

BACKGROUND ART

As a method for distributing a clock signal having a different frequency to each of a plurality of circuits (functional blocks) integrated in one semiconductor device, a method in which the frequency of a clock signal having a certain frequency is divided to generate clock signals having lower frequencies for respective functional blocks and the generated clock signals are distributed to the respective functional blocks has been proposed.

In a clock frequency divider circuit that divides the frequency of a clock signal to generate a clock signal having a lower frequency, it is easy to realize a divider circuit whose frequency division ratio, i.e., the ratio of the frequency of the generated clock signal to the frequency of the original clock signal is expressed as "1/M" (M is integer) (integer frequency divider circuit) by using a counter circuit.

Further, divider circuits capable of performing a frequency division even when the frequency division ratio is expressed as "N/M" (N and M are integers) (rational-number frequency divider circuit) have been also proposed (for example, Patent literatures 1 and 2). According to the related-art techniques disclosed in these literatures, firstly, the value of the numerator of the frequency division ratio (the value of N in the frequency division ratio N/M) is cumulatively added at each cycle of the input clock signal. Next, if the addition result becomes larger than the value of the denominator of the frequency division ratio (the value of M in the frequency division ratio N/M), M is subtracted from the cumulative addition result. By performing these operations, and then appropriately masking (thinning out) clock pulses of the input clock signal by referring to the cumulative addition result, the related-art technique realizes a rational-number frequency division.

Further, as semiconductor devices become increasingly larger in scale and their operating frequencies become increasingly faster, the relative phase deviation between clock signals distributed in the semiconductor device, i.e., the so-called "clock skew" has been becoming a serious problem. If the clock skew becomes larger, the upper limit of the operating frequency of synchronous circuits is restricted, thus causing deterioration in performance.

As a technique to reduce the clock skew, clock tree circuits have been known in which clock buffers and clock wiring lines are arranged in a tree-like configuration. In this clock tree circuit, a clock buffer(s) are used at each level of the clock tree. Further, by designing the layout so that load capacities and wiring resistances become equal to each other, the delays that are caused in clock propagation paths extending from the input end of the clock tree to the respective output ends can be made equal to each other. As a result, it is expected that the phase differences between the clock signals occurring at the respective output ends become relatively smaller, and the clock skew is thereby reduced.

Specific examples of problems that occur in the above-described clock frequency divider circuit and the clock distribution circuit in the related art are explained with reference to FIGS. 14 to 16.

FIG. 14 shows an example of a semiconductor integrated circuit including circuits Ai (i is integer and $1 \le i \le 32$) operating by clocks Ai (i is integer and $1 \le i \le 32$), circuits Bi (i is integer and $1 \le i \le 32$) operating by clocks Bi (i is integer and $1 \le i \le 32$), a communication circuit N operating by a clock N, a clock tree circuit 20, and a plurality of clock frequency divider circuits 100. The circuits Ai and circuits Bi are connected to the communication circuit N, and communicate with each other through the communication circuit N. Each of the clock frequency divider circuits 100 is connected to one of the output ends of the clock tree circuit 20, thus forming a clock distribution circuit composed of the clock tree circuit 20 and the plurality of clock frequency divider circuits 100.

The clock tree circuit 20 uses a clock buffer(s) 22 at each level of the clock tree, and its layout is designed so that load capacities and wiring resistances become equal to each other. In this way, the clock skew of the clock S, the clocks Ai, and the clocks Bi is reduced. Further, the clock N is also distributed by using a clock tree circuit (not shown) so that the distribution delays of the clock N and the clock S become equal to each other. In this way, the clock skew of the clock N, clock S, clocks Ai, and clocks Bi is reduced, thus enabling the circuits Ai and Bi to communicate with the communication circuit N in a synchronized manner.

The clock frequency divider circuits 100 in the related art generate the clocks Ai and the clocks Bi by performing a rational-number frequency division on the clock S, which is distributed by the clock tree circuit 20, based on input frequency division ratio setting.

The clock frequency divider circuits 100 in the related art realize a frequency division by selectively masking clock pulses of the input clock signals. However, this related-art technique does not give any consideration to the communication with the communication circuit N operating by a clock having a different frequency. Therefore, there is a problem that the communication with the communication circuit N requires a special clock transfer circuit and/or special timing design. In addition, there is another problem that the communication performance deteriorates because of the above-described problem. Further, there is another problem that when the frequency division ratio is changed, it is necessary to change the communication timing with the communication circuit N according to that change.

FIG. 15 is a timing diagram showing an example of a clock frequency division performed by a clock frequency divider circuit 100 in the related art. The figure shows clocks Ai and clocks Bi generated by dividing the frequency of the clock S at frequency division ratios 11/12 to 4/12. The clocks Ai and clocks Bi can be generated by appropriately masking clock pulses of the input clock S. For example, a clock Ai and a clock Bi corresponding to the frequency division ratio 9/12 is generated by masking three clock pulses at timings T3, T8 and T11 among the twelve clock pulses at the timings T0 to T11 of the clock S.

In this example, assume that the frequency of the clock N is one third of that of the clock S. That is, the frequency division ratio of the clock N to the clock S is 1/3 (=4/12). Note that the phase relation between the clock N and the clocks Ai makes a full circle in twelve cycles of the clock S. The timings of the twelve cycles, in which the phase relation makes a full circle, are represented by "T0" to "T11".

Assume also that the circuits Ai and Bi communicate with the communication circuit N at the timings T0, T3, T6 and T9, which correspond to all the rising edge timings of the clock N. In particular, at the timings T0, T3, T6 and T9, the circuits Ai and Bi output a signal to the communication circuit N and/or receive a signal sent from the communication circuit N. Similarly, at the timings T0, T3, T6 and T9, the communication circuit N outputs a signal to the circuits Ai and Bi and receives a signal sent from the circuits Ai and Bi.

However, the clock frequency divider circuit 100 in the related art does not give any consideration to the communication with a circuit operating by a clock having a different frequency. Therefore, there are cases where a clock pulse of the clock S is masked even at this communication timing to generate a certain clock Ai or clock Bi.

In the example shown in FIG. 15, some of the clock pulses are masked at the timings T3, T6 and T9 among the communication timings to generate the clocks Ai and Bi. Specifically, at the timing T3, the clock pulse is masked for the frequency division ratios 9/12 (110*a*), 6/12 (110*b*), and 5/12 (110*c*). Similarly, at the timing T6, the clock pulse is masked for the frequency division ratio 5/12 (110*d*). Similarly, at the timing T9, the clock pulse is masked for the frequency division ratios 7/12 (110*e*), 6/12 (110*f*), and 5/12 (110*g*).

If the clock pulse of the clock S is masked at the communication timing to generate a clock Ai and a clock Bi as in the case of the above-described example, a circuit Ai operating by the generated clock Ai cannot receive a signal output from the communication circuit N operating by the clock N at an expected timing. Further, a circuit Bi operating by the generated clock Bi cannot receive a signal output from the communication circuit N operating by the clock N at an expected timing. Similarly, the circuit Ai operating by the clock Ai cannot output a signal at the timing that is expected by the communication circuit N operating by the clock N. Further, the circuit Bi operating by the clock Bi cannot output a signal at the timing that is expected by the communication circuit N operating by the clock N.

Therefore, in the clock frequency divider circuit in the related art, there is a problem that the communication with a circuit operating by a clock having a different frequency requires a special clock transfer circuit and/or special timing design to realize an expected proper communication operation. As a result, there is another problem that the communication performance deteriorates. Further, there is another problem that when the frequency division ratio is changed, it is necessary to change the timing of communication with the circuit operating by a clock having a different frequency according to that change.

Furthermore, in the clock distribution circuit shown in FIG. 14 in which each of the clock frequency divider circuits 100 is connected to one of the output ends of the clock tree circuit 20, the clock S, which is input to the clock tree circuit 20, always has a high frequency because its frequency is not divided. Therefore, there is another problem that the power consumption of the clock tree circuit 20 is large.

Further, although the clock frequency divider circuits 100 in the related art realize a frequency division by selectively masking clock pulses of the input clock signal, they does not give any consideration to the relation with other clock signals even when a plurality of clock signals are used in one LSI chip. As a result, there is a possibility that a circuit operating by a frequency-divided clock signal generated by a clock frequency divider circuit and another circuit operating a clock signal different from the frequency-divided clock signal operate simultaneously at a cycle immediately after a cycle at which they stopped operating simultaneously, and a possibility that they stop operating simultaneously at a cycle immediately after a cycle at which they have operated simultaneously. In such cases, there is a problem that the fluctuation in the current consumption becomes larger. As a result, there is another problem that the power-supply noise and the EMI (Electro Magnetic Interference) noise become larger.

For example, in the clock frequency division example shown in FIG. 15, the clocks Ai are generated without giving any consideration to the relation with the clocks Bi. Similarly, the clocks Bi are generated without giving any consideration to the relation with the clocks Ai. As a result, there could be a case where no clock pulse exists in both of a clock Ai and a clock Bi at a cycle immediately after a cycle at which a clock pulse exists in both of the clock Ai and clock Bi. In this case, a circuit Ai operating by the clock Ai and a circuit Bi operating by the clock Bi stop operating simultaneously at the cycle immediately after the cycle at which they have operated simultaneously. Similarly, there could be a case where a clock pulse exists in both of a clock Ai and a clock Bi at a cycle immediately after a cycle at which no clock pulse exists in both of the clock Ai and clock Bi. In this case, a circuit Ai operating by the clock Ai and a circuit Bi operating by the clock Bi operate simultaneously at the cycle immediately after the cycle at which they stopped operating simultaneously. As a result, the fluctuation in the current consumption becomes larger, and therefore the power-supply noise and the EMI noise become larger.

The above-described problem is explained in a more detailed manner with reference to FIG. 16. FIG. 16 shows a clock frequency division example performed by a clock frequency divider circuit 100 in the related art. In particular, FIG. 16 shows a clock Ai generated by dividing the frequency of a clock S at a frequency division ratio 9/12 and a clock Bi generated by dividing the frequency of the clock S at a frequency division ratio 5/12. Further, FIG. 16 also shows the power consumption of circuits Ai and Bi operating by the clocks Ai and Bi respectively, and power-supply noise caused by the fluctuation in the current consumption.

In this example, at a timing T2, a clock pulse exists in both the clocks Ai and Bi and therefore both the circuits Ai and Bi operate. As a result, the current consumption is large. In contrast to this, at a timing T3, no clock pulse exists in both the clocks Ai and Bi and therefore both the circuits Ai and Bi do not operate. As a result, the current consumption is small. That is, the current consumption significantly changes from a higher state to a lower state over the transition from the timing T2 to the timing T3. As a result, large power-supply noise occurs.

Similarly, at the timing T3, no clock pulse exists in both the clocks Ai and Bi and therefore both the circuits Ai and Bi do not operate. As a result, the current consumption is small. In contrast to this, at a timing T4, a clock pulse exists in both the clocks Ai and Bi and therefore both the circuits Ai and Bi operate. As a result, the current consumption is large. That is, the current consumption significantly changes from a lower state to a higher state over the transition from the timing T3 to the timing T4. As a result, large power-supply noise occurs.

Similarly, at a timing T7, a clock pulse exists in both the clocks Ai and Bi and therefore both the circuits Ai and Bi operate. As a result, the current consumption is large. In contrast to this, at a timing T8, no clock pulse exists in both the clocks Ai and Bi and therefore both the circuits Ai and Bi do not operate. As a result, the current consumption is small. That is, the current consumption significantly changes from a higher state to a lower state over the transition from the timing T7 to the timing T8. As a result, large power-supply noise occurs.

Similarly, at a timing T10, a clock pulse exists in both the clocks Ai and Bi and therefore both the circuits Ai and Bi operate. As a result, the current consumption is large. In contrast to this, at a timing T11, no clock pulse exists in both the clocks Ai and Bi and therefore both the circuits Ai and Bi do not operate. As a result, the current consumption is small. That is, the current consumption significantly changes from a higher state to a lower state over the transition from the timing T10 to the timing T11. As a result, large power-supply noise occurs.

Similarly, at a timing T11, no clock pulse exists in both the clocks Ai and Bi and therefore both the circuits Ai and Bi do not operate. As a result, the current consumption is small. In contrast to this, at a timing T0, a clock pulse exists in both the clocks Ai and Bi and therefore both the circuits Ai and Bi operate. As a result, the current consumption is large. That is, the current consumption significantly changes from a lower state to a higher state over the transition from the timing T11 to the timing T0. As a result, large power-supply noise occurs.

As described above, since the clock frequency divider circuit 100 in the related art does not give any consideration to the relation with other clock signals, the fluctuation in the current consumption could become larger. As a result, there is a problem that the power-supply noise becomes larger. Further, although only the problem of the increased power-supply noise is explained in a detained manner in the example shown in FIG. 16, there is another problem that the EMI noise, which is caused by fluctuations in the current consumption, also becomes larger.

Furthermore, in the clock distribution circuit in the related art shown in FIG. 14 in which each of the clock frequency divider circuits 100 is connected to one of the output ends of the clock tree circuit 20, the clock S, which is distributed by the clock tree circuit 20, always has a high frequency because its frequency is not divided. Therefore, there is another problem that the power consumption of the clock tree circuit 20 is large.

CITATION LIST

Patent Literature

Japanese Unexamined Patent Application Publication No. 2005-45507
Japanese Unexamined Patent Application Publication No. 2006-148807

SUMMARY OF INVENTION

Technical Problem

As explained above, in the clock frequency divider circuit and the clock distribution circuit in the related art, there are cases where a plurality of circuit blocks operate simultaneously immediately after they stopped operating simultaneously, and where they stop simultaneously immediately after they have operated simultaneously, so that the fluctuation in the power consumption becomes larger. As a result, there is a problem that the power-supply noise and the EMI noise become larger due to the large fluctuation.

The present invention has been made in view of the above-described problems, and an object of the present invention is to provide a clock frequency divider circuit, a clock distribution circuit, a clock frequency division method, and a clock distribution method capable of suppressing the occurrence of the power-supply noise and the EMI noise.

Solution to Problem

A clock frequency divider circuit in accordance with the present invention is a clock frequency divider circuit that generates an output clock signal obtained by dividing a frequency of an input clock signal into N/S (N is positive integer and S is positive integer greater than N) by masking (S-N) clock pulses from S clock pulses of the input clock signal based on a frequency division ratio defined as N/S, the clock frequency divider circuit including: a mask control circuit that generates a mask signal in which a non-mask timing is preferentially assigned to a clock pulse at a timing at which no clock pulse exists in a clock signal used in a circuit other than a target circuit using the output clock signal among S clock pulses of the input clock signal; and a mask circuit that generates the output clock signal by masking a clock pulse of the input clock signal according to the mask signal generated by the mask control circuit.

Further, a clock distribution circuit in accordance with the present invention includes: a clock tree circuit; a first clock frequency divider circuit that receives a clock signal output from the clock tree circuit, performs a frequency division on the received signal, and outputs a first output clock signal to a first circuit; and a second clock frequency divider circuit that receives a clock signal output from the clock tree circuit, performs a frequency division on the received signal, and outputs a second output clock signal to a second circuit; wherein the second clock frequency divider circuit generates the second output clock signal so that the second output clock signal preferentially includes a clock pulse at a timing at which no clock pulse exists in the first output clock signal.

Further, a clock frequency division method in accordance with the present invention is a clock frequency division method to generate an output clock signal obtained by dividing a frequency of an input clock signal into N/S (N is positive integer and S is positive integer greater than N) by masking (S-N) clock pulses from S clock pulses of the input clock signal based on a frequency division ratio defined as N/S, the clock frequency division method including: determining that a clock pulse at a timing at which no clock pulse exists in a clock signal used in a circuit other than a target circuit using the output clock signal among S clock pulses of the input clock signal is preferentially left unmasked; and generating the output clock signal by masking a clock pulse other than the determined clock pulse.

A clock distribution method in accordance with the present invention includes: performing a frequency division on a clock signal output from a clock tree circuit and outputting a first output clock signal to a first circuit; and performing a frequency division on a clock signal output from the clock tree circuit to generate a second output clock signal so that the second output clock signal preferentially includes a clock pulse at a timing at which no clock pulse exists in the first output clock signal, and outputting the generated second output signal to a second circuit.

Advantageous Effects of Invention

In accordance with the present invention, it is possible to provide a clock frequency divider circuit, a clock distribution circuit, a clock frequency division method, and a clock distribution method capable of suppressing the occurrence of the power-supply noise and the EMI noise.

DESCRIPTION OF EMBODIMENTS

First Exemplary Embodiment

Next, exemplary embodiments in accordance with the present invention are explained with reference to the drawings.

Figure 1:
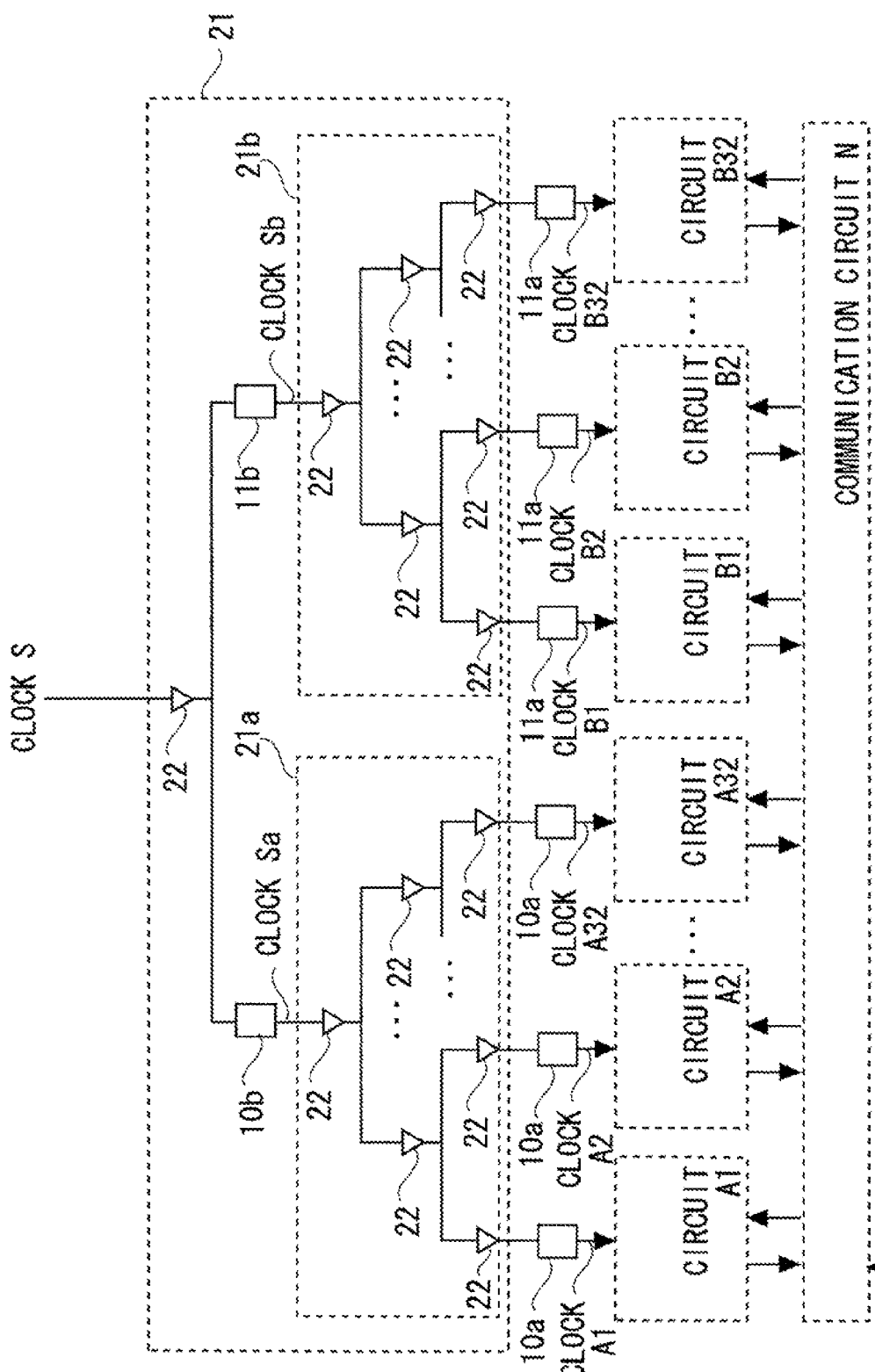
FIG. 1 is a configuration diagram of a semiconductor integrated circuit in the present invention.
Figure 14:
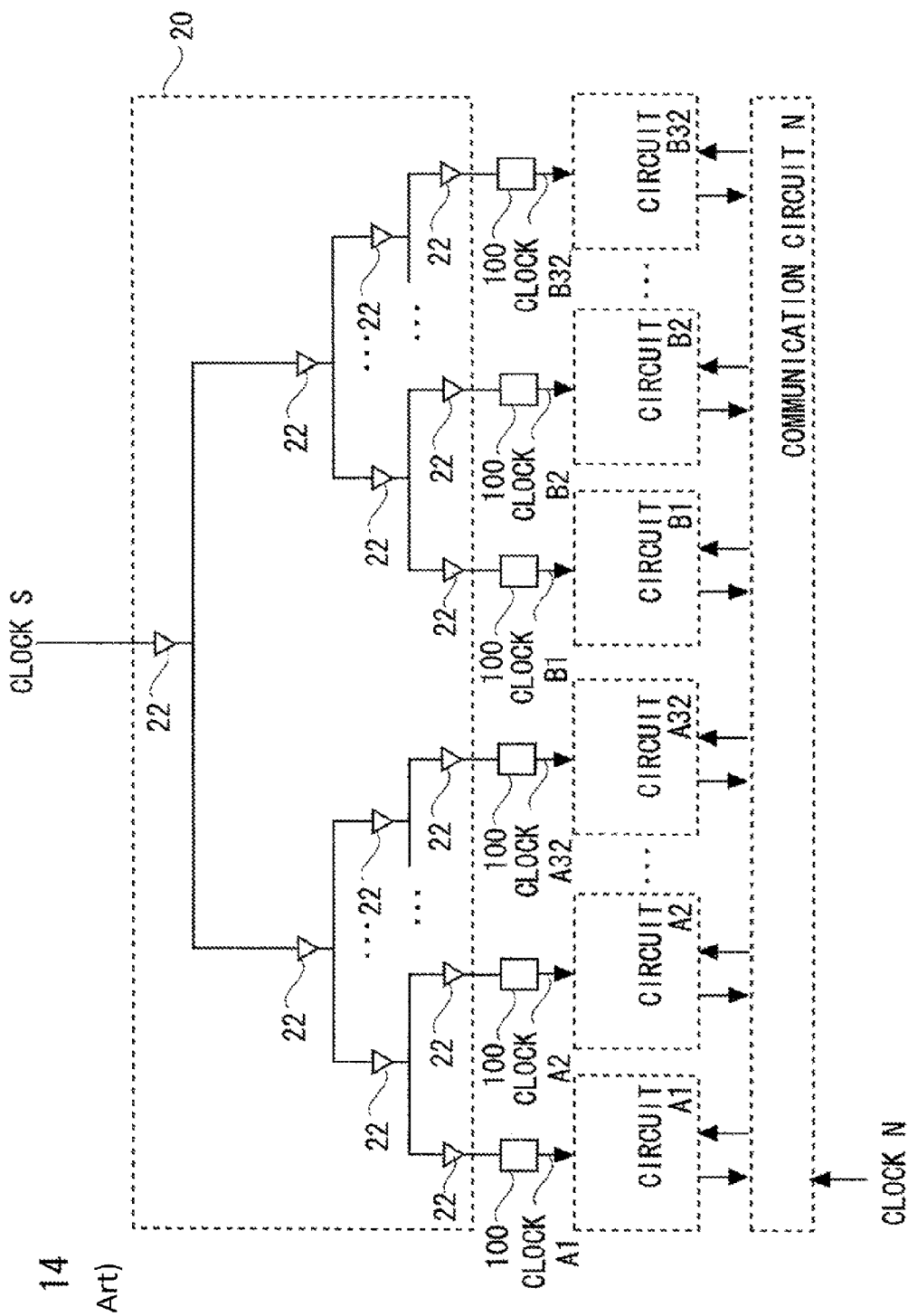
FIG. 14 is a configuration diagram of a semiconductor integrated circuit in related art.

FIG. 1 shows an example of a semiconductor integrated circuit including circuits Ai (i is integer and 1≤i≤32) operating by clocks Ai (i is integer and 1≤i≤32), circuits Bi (i is integer and 1≤i≤32) operating by clocks Bi (i is integer and 1≤i≤32), a communication circuit N operating by a clock N, a clock tree circuit 21, and clock frequency divider circuits 10a, 10b, 11a and 11b. The same components as those of the semiconductor integrated circuit in the related art shown in FIG. 14 are denoted by the same signs.

The circuits Ai and circuits Bi are connected to the communication circuit N, and communicate with each other through the communication circuit N.

The clock tree circuit 21 is formed from two partial clock tree circuits 21a and 21b. The clock frequency divider circuit 10b is connected to the input end of the partial clock tree circuits 21a and each of the clock frequency divider circuits 10a is connected to one of the output ends of the partial clock tree circuits 21a, thus forming a clock distribution circuit for circuits Ai. Similarly, the clock frequency divider circuit 11b is connected to the input end of the partial clock tree circuits 21b and each of the clock frequency divider circuits 11a is connected to one of the output ends of the partial clock tree circuits 21b, thus forming a clock distribution circuit for circuits Bi.

The clock tree circuit 21 and its partial clock tree circuits 21a and 21b use a clock buffer(s) 22 at each level of the clock tree, and their layout is designed so that load capacities and wiring resistances become equal to each other. By doing so, the clock skew of the clock S is reduced. Further, the clock N is also distributed by using a clock tree circuit (not shown) so that the distribution delays of the clock N and the clock S become equal to each other. In this way, the clock skew of the clock N, clock S, clocks Ai, and clocks Bi is reduced, thus enabling the circuits Ai and Bi to communicate with the communication circuit N in a synchronized manner.

Figure 2:
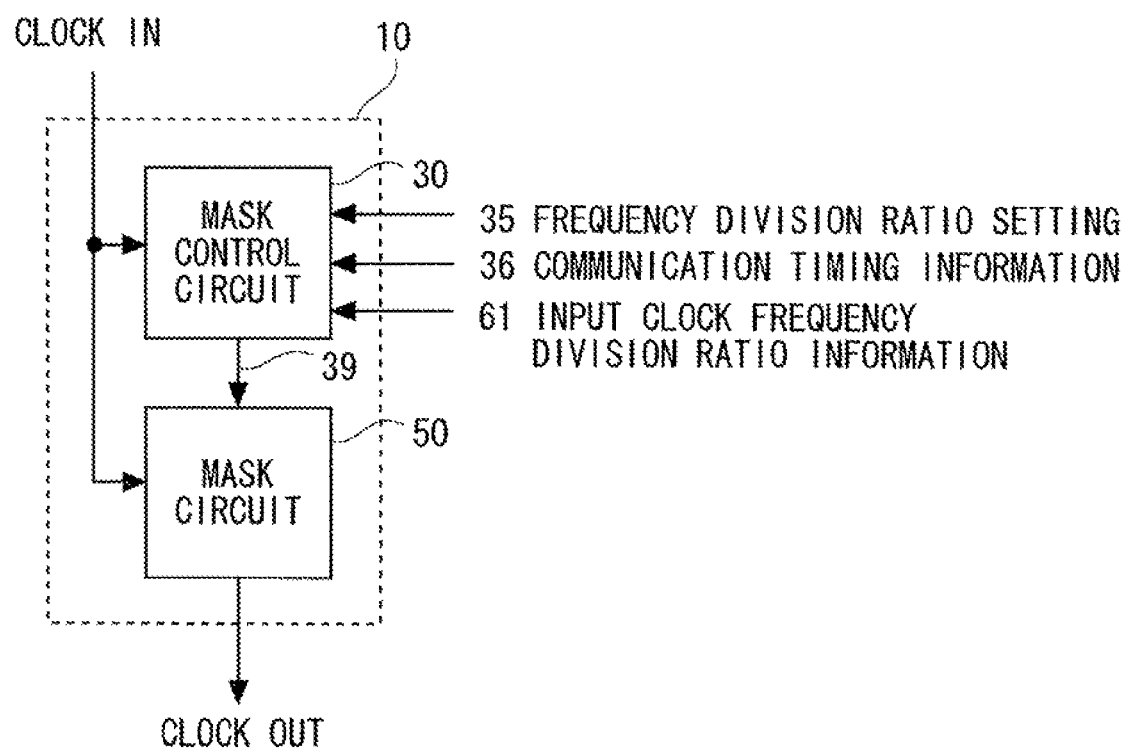
FIG. 2 is a configuration diagram of a clock frequency divider circuit in accordance with a first exemplary embodiment of the present invention.

FIG. 2 is a configuration diagram showing a configuration of a clock frequency divider circuit 10 in accordance with this exemplary embodiment. The clock frequency divider circuit 10 is a circuit that masks (S−N) clock pulses among consecutive S clock pulses of a clock IN (input clock signal) based on frequency division ratio defined as N/M (N is positive integer and M is positive integer greater than N) given by frequency division ratio setting 35 and frequency division ratio information of the clock IN defined as S/M (S is positive integer and M is positive integer greater than S) given by input clock frequency division ratio information 61 in order to generate a clock OUT (output clock signal) that is obtained by performing a rational-number frequency division on the clock IN at a frequency division ratio N/S.

Note that the clock IN is a clock obtained by dividing the frequency of the original clock signal into S/M. Therefore, the clock frequency divider circuit 10 generates a clock OUT that is equivalent to a clock obtained by dividing the frequency of the original clock signal, on which no frequency division was performed, at a frequency division ratio N/M. In other words, the clock frequency divider circuit 10 is a circuit that performs, based on a frequency division ratio N/M given by the frequency division ratio setting 35, a rational-number frequency division on an input clock signal, whose frequency was divided at a frequency division ratio S/M given by the input clock frequency division ratio information 61, at a frequency division ratio N/S in order to generate an output clock signal that is equivalent to a clock signal obtained by dividing the frequency of the original clock signal, on which no frequency division was performed, at the frequency division ratio N/M (=(S/M)×(N/S)).

Further, in addition to the above-described frequency division ratio setting 35 and the input clock frequency division ratio information 61, the clock frequency divider circuit 10 also receives communication timing information 36 indicating timings at which a circuit operating by a clock OUT performs communication, and generates a clock OUT in which the communication timings is taken into account based on these information items.

This clock frequency divider circuit 10 includes, as principal circuits, a mask circuit 50 and a mask control circuit 30.

The mask circuit 50 is a processing circuit having a function of masking clock pulses of a clock IN according to an input mask signal 39 and thereby generating and outputting a clock OUT.

The mask control circuit 30 is a control circuit having a function of outputting a mask signal 39 to the mask circuit 50. In the mask signal 39, based on the communication timing information 36 indicating timings at which a circuit operating by the clock OUT performs communication, (S-N) mask timings at each of which a clock pulse is masked are assigned. The (S-N) mask timings are selected from any timings except for the communication timings at which the communication is performed among the consecutive S clock pulse timings.

Further, the mask control circuit 30 has a function of generating such a mask signal 39 that, for any timings at which a mask timing is assigned in the mask signal 39 when the frequency division ratio is small (the value of N/M or N/S is large), a mask timing is always assigned at those timings in the mask signal 39 when the frequency division ratio is larger (the value of N/M or N/S is smaller). Then, the mask control circuit 30 outputs the mask signal 39 to the mask circuit 50.

In the exemplary embodiment shown in FIG. 1, each of the clock frequency divider circuits 10a and the clock frequency divider circuit 10b is a clock frequency divider circuit having the same configuration as that of the clock frequency divider circuit 10. The clock frequency divider circuits 10a generate clocks Ai by performing a rational-number frequency division on a clock Sa, which is distributed by the partial clock tree circuit 21a, based on the input frequency division ratio setting 35, the communication timing information 36, and the input clock frequency division ratio information 61. The clock frequency divider circuit 10b generates the clock Sa, which is distributed by the partial clock tree circuit 21a, by performing a rational-number frequency division on a clock S based on the input frequency division ratio setting 35, the communication timing information 36, and the input clock frequency division ratio information 61.

Figure 3:
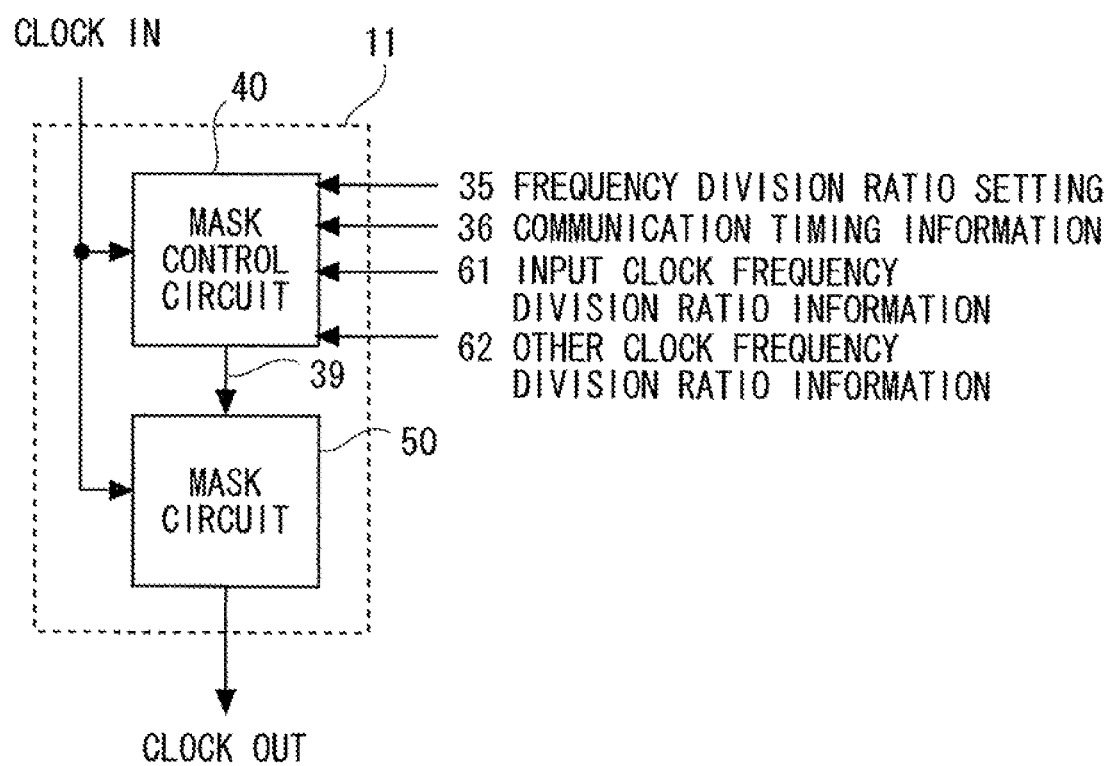
FIG. 3 is a configuration diagram of a clock frequency divider circuit in accordance with a first exemplary embodiment of the present invention.

FIG. 3 is a configuration diagram showing a configuration of a clock frequency divider circuit 11 in accordance with this exemplary embodiment. The same or similar components to those of the clock frequency divider circuit 10 shown in FIG. 2 are denoted by the same signs.

Similarly to the clock frequency divider circuit 10, the clock frequency divider circuit 11 is a circuit that masks (S-N) clock pulses among consecutive S clock pulses of a clock IN (input clock signal) based on frequency division ratio defined as N/M (N is positive integer and M is positive integer greater than N) given by frequency division ratio setting 35 and frequency division ratio information of the clock IN defined as S/M (S is positive integer and M is positive integer greater than S) given by input clock frequency division ratio information 61 in order to generate a clock OUT (output clock signal) that is obtained by performing a rational-number frequency division on the clock IN at a frequency division ratio N/S.

Note that the clock IN is a clock obtained by dividing the frequency of the original clock signal into S/M. Therefore, the clock frequency divider circuit 11 generates a clock OUT that is equivalent to a clock obtained by dividing the frequency of the original clock signal, on which no frequency division was performed, at a frequency division ratio N/M. In other words, the clock frequency divider circuit 11 is a circuit that performs, based on a frequency division ratio N/M given by the frequency division ratio setting 35, a rational-number frequency division on an input clock signal, whose frequency was divided at a frequency division ratio S/M given by the input clock frequency division ratio information 61, at a frequency division ratio N/S in order to generate an output clock signal that is equivalent to a clock signal obtained by dividing the frequency of the original clock signal, on which no frequency division was performed, at the frequency division ratio N/M (=(S/M)×(N/S)).

Further, in addition to the above-described frequency division ratio setting 35 and the input clock frequency division ratio information 61, the clock frequency divider circuit 11 also receives communication timing information 36 indicating timings at which a circuit operating by a clock OUT performs communication, and generates a clock OUT in which the communication timings is taken into account based on these information items.

In addition to the above-described frequency division ratio setting 35, the input clock frequency division ratio information 61, and the communication timing information 36, the clock frequency divider circuit 11 also receives other-clock frequency division ratio information 62 indicating frequency division ratio information of other clocks (e.g., clocks Ai) used in the same semiconductor integrated circuit, and generates a clock signal that makes it possible to suppress the fluctuation in the current consumption of the circuits Ai and Bi based on these information items.

This clock frequency divider circuit 11 includes, as principal circuits, a mask circuit 50 and a mask control circuit 40.

The mask circuit 50 is a processing circuit having a function of masking clock pulses of a clock IN according to an input mask signal 39 and thereby generating and outputting a clock OUT.

The mask control circuit 40 is a control circuit having a function of outputting a mask signal 39 to the mask circuit 50. In the mask signal 39, non-mask timings are first assigned with the highest priority to communication timings at which the communication is performed among the consecutive S clock pulse timings based on the communication timing information 36, and then non-mask timings are preferentially assigned to timings at which no clock pulse exists in other clocks based on the other-clock frequency division ratio information 62.

Further, the mask control circuit 40 has a function of generating such a mask signal 39 that, for any timings at which a mask timing is assigned in the mask signal 39 when the frequency division ratio is small (the value of N/M or N/S is large), a mask timing is always assigned at those timings in the mask signal 39 when the frequency division ratio is larger (the value of N/M or N/S is smaller). Then, the mask control circuit 30 outputs the mask signal 39 to the mask circuit 50.

In this exemplary embodiment shown in FIG. 1, each of the clock frequency divider circuits 11a and 11b is a clock frequency divider circuit having the same configuration as that of the clock frequency divider circuit 11. The clock frequency divider circuits 11a generate clocks Bi by performing a rational-number frequency division on a clock Sb, which is distributed by the partial clock tree circuit 21b, based on the input frequency division ratio setting 35, the communication timing information 36, the input clock frequency division ratio information 61, and the other-clock frequency division ratio information 62. The clock frequency divider circuit 11b generates the clock Sb, which is distributed by the partial clock tree circuit 21b, by performing a rational-number frequency division on a clock S based on the input frequency division ratio setting 35, the communication timing information 36, the input clock frequency division ratio information 61, and the other-clock frequency division ratio information 62.

All the circuits Ai and Bi communicate with the communication circuit N at the same timing, e.g., at all the rising edge timings of the clock N. Therefore, the same communication timing information 36 indicating this timing is supplied to all the clock frequency divider circuits 10a, 10b, 11a and 11b.

In contrast to this, the operating frequencies of the circuits Ai and Bi may be different from one another. Therefore, frequency division ratio setting 35 having a different value may be supplied to each of the clock frequency divider circuits 10a and 11a. Further, as for the frequency division ratio setting 35 of the clock frequency divider circuit 10b, the same value as that of frequency division ratio setting 35 in which the smallest frequency division ratio (the value of N/M is large) among all the clock frequency divider circuits 10a is set is supplied. Similarly, for the frequency division ratio setting 35 of the clock frequency divider circuit 11b, the same value as that of frequency division ratio setting 35 in which the smallest frequency division ratio (the value of N/M is large) among all the clock frequency divider circuits 11a is set is supplied.

Further, input clock frequency division ratio information 61 indicating the frequency of the clock Sa, which is the input clock to the clock frequency divider circuits 10a, is supplied to each of the clock frequency divider circuits 10a. Similarly, input clock frequency division ratio information 61 indicating the frequency of the clock S, which is the input clock to the clock frequency divider circuit 10b, is supplied to the clock frequency divider circuit 10b. Meanwhile, input clock frequency division ratio information 61 indicating the frequency of the clock Sb, which is the input clock to the clock frequency divider circuits 11a, is supplied to each of the clock frequency divider circuits 11a. Similarly, input clock frequency division ratio information 61 indicating the frequency of the clock S, which is the input clock to the clock frequency divider circuit 11b, is supplied to the clock frequency divider circuit 11b.

Further, the other-clock frequency division ratio information 62 indicating the frequencies of a clock Ai as another clock signal is supplied to each of the clock frequency divider circuits 11a and 11b. Note that different other-clock frequency division ratio information 62 having a different value may be supplied to each of the clock frequency divider circuits 11a and 11b. Alternatively, common other-clock frequency division ratio information 62 having the same value representing the frequencies of all the clocks Ai (e.g., mean value of the frequencies) may be supplied to each of the clock frequency divider circuits 11a and 11b.

The frequency division ratio setting 35, the communication timing information 36, and the input clock frequency division ratio information 61, which are supplied to the clock frequency divider circuits 10a and 10b, may be supplied by a circuit at a higher level (not shown) or may be supplied by one of the circuits Ai and circuits Bi. Similarly, the frequency division ratio setting 35, the communication timing information 36, the input clock frequency division ratio information 61, and the other-clock frequency division ratio information 62, which are supplied to the clock frequency divider circuits 11a and 11b, may be supplied by a circuit at a higher level (not shown) or may be supplied by one of the circuits Ai and circuits Bi.

Next, an operation of a clock frequency divider circuit in accordance with the first exemplary embodiment of the present invention is explained with reference to FIGS. 4 to 7.

Figure 4:
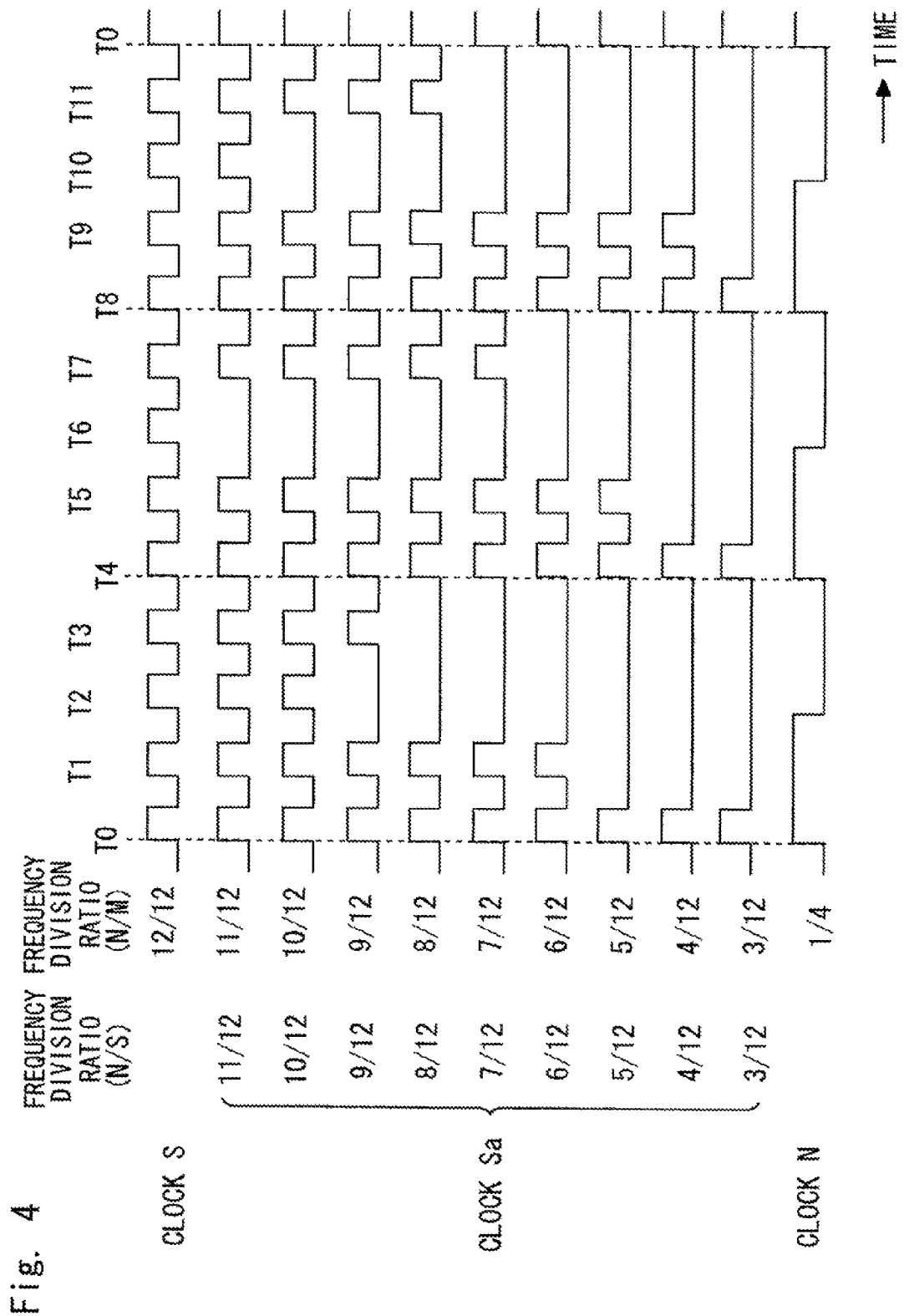
FIG. 4 is a timing chart of an example of a clock frequency division in accordance with a first exemplary embodiment of the present invention.

Firstly, an operation of a clock frequency divider circuit 10b in accordance with the first exemplary embodiment of the present invention is explained with reference to FIG. 4. FIG. 4 is a timing chart showing an operation of a clock frequency division circuit 10b in accordance with a first exemplary embodiment of the present invention. Assuming that frequency division ratio denominator M=12 and frequency division ratio numerator N=11 to 3, an example in which the frequency of a clock S is divided at frequency division ratios 11/12 to 3/12 to generate clocks Sa is explained.

Further, the clock S, which is an input clock signal, is a clock signal on which no frequency division was performed. Therefore, for the frequency division ratio S/M of the clock S given by the input clock frequency division ratio information 61, the input clock frequency division ratio numerator S=12 and the input clock frequency division ratio denominator M=12. Therefore, in this example, N/M=N/S.

In FIG. 4, the frequency of the clock N is one fourth of that of the clock S. That is, a case where the frequency division ratio of the clock N to the clock S is 1/4 (=3/12) and the clock N is in synchronization with the clock S is shown. In this case, the phase relation between the clock N and the clocks Sa makes a full circle in twelve cycles of the clock S. In FIG. 4, the timings of the twelve cycles, in which the phase relation makes a full circle, are represented by "T0" to "T11". The circuits Ai perform data communication at the timings T0, T4 and T8 corresponding to the rising edge timings of the clock N.

The difference between the clock frequency divider circuit 10 in accordance with the present invention and the clock frequency divider circuit 100 in the related art lies in that the clock frequency divider circuit 10 in accordance with the present invention receives the above-described communication timing information indicating communication timings and thereby performs a rational-number frequency division in which the communication timings are taken into account based on the communication timing information. Specifically, clock pulses located at communication timings are never masked, and a rational-number frequency division is performed by masking clock pulses located at timings other than the communication timings. Further, for any timings at which a clock pulse is masked when the frequency division ratio is small (the value of N/M or N/S is large), the clock pulse is always masked at those timings when the frequency division ratio is larger (the value of N/M or N/S is smaller) to realize a rational-number frequency division.

In the example of the clock frequency division shown in FIG. 4, the clocks Sa are generated by:

(1) masking no clock pulse at the timings T0, T4 and T8, which are the communication timings, and masking clock pulses at any of the timings T1, T2, T3, T5, T6, T7, T9, T10 and T11, which are not the communication timings; and (2) for any timings at which a clock pulse is masked when a frequency division ratio is small, masking the clock pulse without fail at those timings when the frequency division ratio is larger.

Therefore, the mask control circuit 30 generates a mask signal 39 in which mask timings are assigned in such a manner that (S-N) clock pulses are masked at any of the timings T1, T2, T3, T5, T6, T7, T9, T10 and T11, which are not the above-described communication timings, and for any timings at which a clock pulse is masked when the frequency division ratio is small, the clock pulse is always masked at those timings when the frequency division ratio is larger.

The clocks Sa like these can be generated by additionally assigning a timing at which a clock pulse is masked in a clock S' corresponding to a smaller frequency division ratio.

For example, a clock Sa corresponding to a frequency division ratio 11/12 can be generated by assigning a mask timing at any timing other than the timings T0, T4 and T8 among the twelve clock pulses at timings T0 to T11 of the clock S, e.g., at a timing T6. Further, a clock Sa corresponding to a frequency division ratio 10/12 can be generated by additionally assigning a mask timing at a timing T10. Further, a clock Sa corresponding to a frequency division ratio 9/12 can be generated by additionally assigning a mask timing at a timing T2. Further, a clock Sa corresponding to a frequency division ratio 8/12 can be generated by additionally assigning a mask timing at a timing T3.

Further, a clock Sa corresponding to a frequency division ratio 7/12 can be generated by additionally assigning a mask timing at a timing T11. Further, a clock Sa corresponding to a frequency division ratio 6/12 can be generated by additionally assigning a mask timing at a timing T7. Further, a clock Sa corresponding to a frequency division ratio 5/12 can be generated by additionally assigning a mask timing at a timing T1. Further, a clock Sa corresponding to a frequency division ratio 4/12 can be generated by additionally assigning a mask timing at a timing T5. Further, a clock Sa corresponding to a frequency division ratio 3/12 can be generated by additionally assigning a mask timing at a timing T9.

A specific generation method of a clock Sa is explained with reference to FIG. 4. The clock frequency divider circuit 10*b* receives the input clock frequency division ratio information 61 and the other-clock frequency division ratio information 62, and generates a clock Sa with consideration given to the communication timings. When a clock Sa is generated by dividing the frequency of the clock S at a frequency division ratio N/S (S and N are integers), it is necessary to assign non-mask timings to N cycles at each of which a clock pulse is output among the consecutive S cycles of the clock S. The assign process is performed in accordance with the following procedure.

(Step 1) Non-mask timings are assigned to cycles located at the communication timings. If non mask timings corresponding to all of N cycles can be assigned, the assign process is finished.

(Step 2) The remaining non-mask timings of N cycles are assigned to cycles which are located immediately before or immediately after communication timing cycles and which are cycles other than the cycles to which mask timings are assigned when the frequency division ratio is smaller (the value of N/M or N/S is larger). If non mask timings corresponding to all of N cycles can be assigned, the assign process is finished.

(Step 3) All the remaining non-mask timings of N cycles are assigned to cycles which are cycles other than the cycles to which non-mask timings are assigned in the steps 1 and 2 and which are cycles other than the cycles to which mask timings are assigned when the frequency division ratio is smaller (the value of N/M or N/S is larger), and the assign process is finished.

The select process in accordance with the above-described procedure in a case where the frequency division ratio of the clock Sa is 10/12 is explained in a detailed manner with reference to FIG. 4. Since the frequency division ratio of the clock Sa is 10/12, ten cycles at each of which a clock pulse is output are selected from twelve cycles indicated by timings T0 to T11.

Firstly, in a step 1, three cycles at timings T0, T4 and T8, which are communication timings, are selected.

The number of the selected cycles is less than ten. Therefore, in the next step 2, the remaining cycles of the ten cycles are selected from cycles which are located immediately before or immediately after the communication timing cycles and which are cycles other than the cycle at the timing T6 to which a mask timing is assigned when the frequency division ratio is smaller, i.e., when the frequency division ratio is 11/12. In this step, six cycles at timings T1, T3, T5, T7, T9 and T11 are selected.

The number of the selected cycles is still smaller than ten by one. Therefore, in the next step 3, one cycle is selected from cycles other than the cycle at the timing T6 to which a mask timing is assigned when the frequency division ratio is smaller, i.e., when the frequency division ratio is 11/12. In this step, the timing T2 is selected as an example.

With the above-described procedure, non-mask timings are assigned to the timings T0, T1, T2, T3, T4, T5, T7, T8, T9 and T11 among the twelve cycles at the timings T0 to T11 as the ten cycles at each of which a clock pulse is output.

Figure 5:
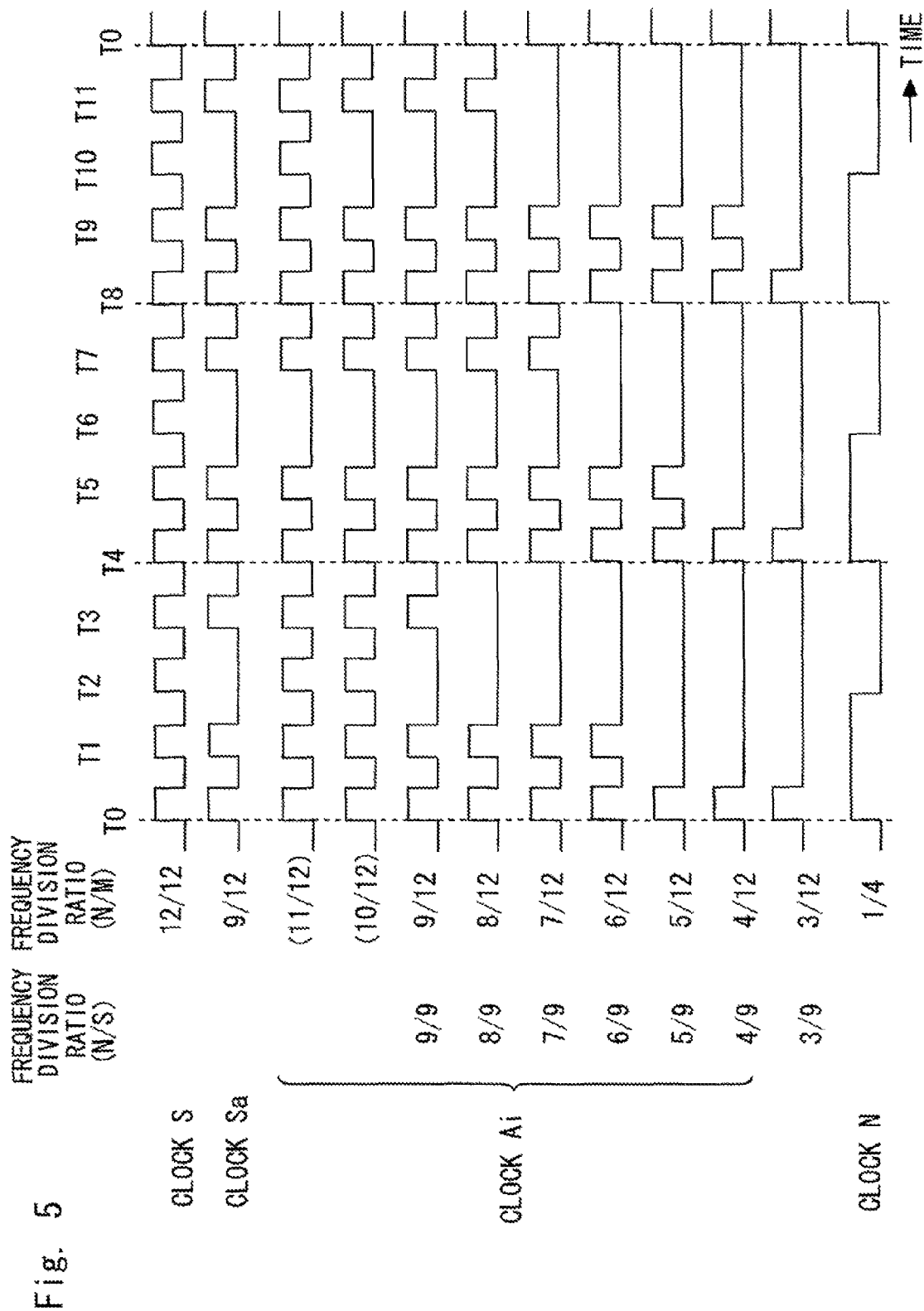
FIG. 5 is a timing chart of an example of a clock frequency division in accordance with a first exemplary embodiment of the present invention.

Next, an operation of a clock frequency divider circuit 10*a* in accordance with the first exemplary embodiment of the present invention is explained with reference to FIG. 5. FIG. 5 is a timing chart showing an operation of a clock frequency divider circuit 10*a* in accordance with the first exemplary embodiment, of the present invention. The operation of the clock frequency divider circuit 10*a* is the same as that of the clock frequency divider circuit 10*b* shown in FIG. 4 except that its input clock is a clock Sa whose frequency is possibly divided by the clock frequency divider circuit 10*b*. Further, the timing at which a clock pulse is masked for the clock S is also the same.

A case where the frequency division ratio denominator M=12 and the frequency division ratio numerator N=9 to 3 for a frequency division ratio N/M given by the frequency division ratio setting 35 is explained hereinafter as an example. In this example, assume that the clock Sa, which is the input clock signal, is a clock obtained by dividing the frequency of the clock S at a frequency division ratio 9/12. Therefore, for the frequency division ratio S/M defining the frequency division ratio of the clock Sa that is given by the input clock frequency division ratio information 61, the input clock frequency division ratio numerator S=9 and the input clock frequency division ratio denominator M=12.

That is, it is an example case where the frequency of the clock Sa corresponding to a frequency division ratio 9/12 is divided at frequency division ratios 9/9 to 3/9 to generate clocks Ai. Therefore, it is an example case where clocks Ai equivalent to clock signals obtained by dividing the frequency of the clock S at frequency division ratios 9/12 to 3/12.

As described previously, for the frequency division ratio setting 35 of the clock frequency divider circuit 10*b*, the same value as that of frequency division ratio setting 35 in which the smallest frequency division ratio (the value of N/M is large) among all the clock frequency divider circuits 10*a* is set is supplied. Therefore, in this example, the clock frequency divider circuit 10*a* generates a clock Ai that is obtained by performing a frequency division at one of the frequency division ratios 9/12 to 3/12. FIG. 5 also shows the waveforms of clocks Ai corresponding to frequency division ratios 11/12 and 10/12 for the sake of comparison to those of FIG. 4. However, these frequency division ratios are never set in this example.

Similarly to FIG. 4, the frequency of the clock N is one fourth of the clock S in FIG. 5. That is, a case where the frequency division ratio of the clock N to the clock S is 1/4 (=3/12) and the clock N is in synchronization with the clock S is shown. Further, the clock Sa is generated by dividing the frequency of the clock S at a frequency division ratio 9/12. In this case, the phase relation between the clock N and the clock Sa, and between the clock N and the clocks Ai makes a full circle in twelve cycles of the clock S. In FIG. 5, the timings of the twelve cycles, in which the phase relation makes a full circle, are represented by "T0" to "T11". The circuits Ai and the circuits Bi perform data communication at the timings T0, T4 and T8 corresponding to the rising edge timings of the clock N.

In the example of the clock frequency division shown in FIG. 5, the clocks Ai are also generated by:

(1) masking no clock pulse at the timings T0, T4 and T8, which are the communication timings, and masking clock pulses at any of the timings T1, T2, T3, T5, T6, T7, T9, T10 and T11, which are not the communication timings; and (2) for any timings at which a clock pulse is masked when a frequency division ratio is small, masking the clock pulse without fail at those timings when the frequency division ratio is larger.

Therefore, the mask control circuit 30 generates a mask signal 39 in which mask timings are assigned in such a manner that (S-N) clock pulses are masked at any of the timings T1, T2, T3, T5, T6, T7, T9, T10 and T11, which are not the communication timings, and for any timings at which a clock pulse is masked when the frequency division ratio is small, the clock pulse is always masked at those timings when the frequency division ratio is larger.

Figure 6:
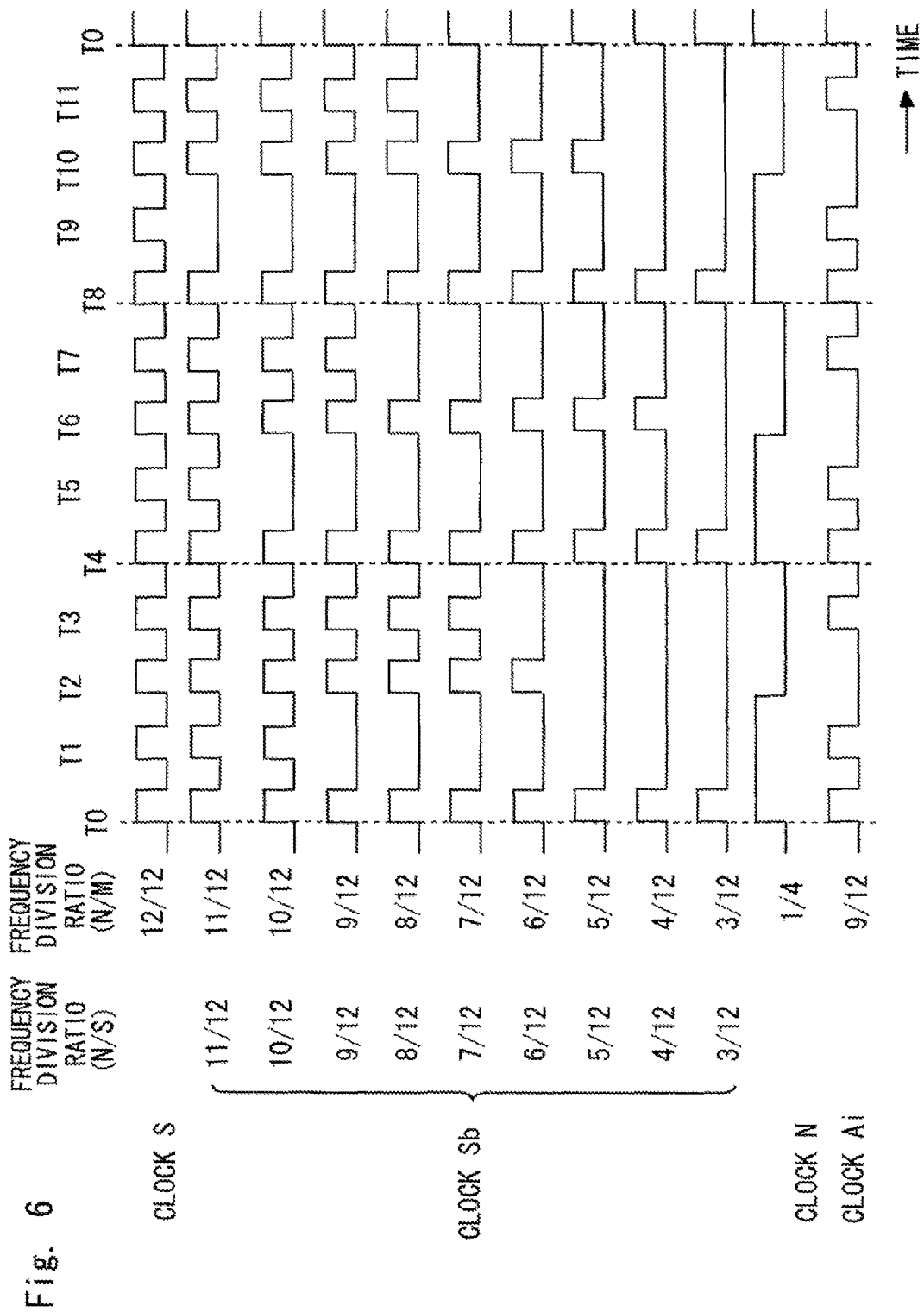
FIG. 6 is a timing chart of an example of a clock frequency division in accordance with a first exemplary embodiment of the present invention.

Next, an operation of a clock frequency divider circuit 11b in accordance with the first exemplary embodiment of the present invention is explained with reference to FIG. 6. FIG. 6 is a timing chart showing an operation of a clock frequency divider circuit 11b in accordance with the first exemplary embodiment of the present invention. Assuming that frequency division ratio denominator M=12 and frequency division ratio numerator N=11 to 3, an example in which the frequency of a clock S is divided at frequency division ratios 11/12 to 3/12 to generate clocks Sb is explained.

Further, the clock S, which is an input clock signal, is a clock signal on which no frequency division was performed. Therefore, for the frequency division ratio S/M of the clock S given by the input clock frequency division ratio information 61, the input clock frequency division ratio numerator S=12 and the input clock frequency division ratio denominator M=12. Therefore, in this example, N/M=N/S.

In FIG. 6, the frequency of the clock N is one fourth of that of the clock S. That is, a case where the frequency division ratio of the clock N to the clock S is 1/4 (=3/12) and the clock N is in synchronization with the clock S is shown. In this case, the phase relation between the clock N and the clocks Sb makes a full circle in twelve cycles of the clock S. In FIG. 6, the timings of the twelve cycles, in which the phase relation makes a full circle, are represented by "T0" to "T11". The circuits Bi perform data communication at the timings T0, T4 and T8 corresponding to the rising edge timings of the clock N. Further, assume that the frequency division ratio of the clock Ai is 9/12 in this example.

The clock frequency divider circuit 11b receives the above-described input clock frequency division ratio information 61 indicating the communication timings, and performs a rational-number frequency division based on the received input clock frequency division ratio information 61. Specifically, the clock frequency divider circuit 11b does not mask clock pulses located at communication timings and does mask some of the clock pulses located at timings other than the communication timings. In the frequency division example shown in FIG. 6, clock frequency divider circuit 11b does not mask any clock pulse at the timings T0, T4 and T8, which are the communication timings, and does mask some of clock pulses at the timings T1, T2, T3, T5, T6, T7, T9, T10 and T11 to generate clocks Sb.

In this process, the clock frequency divider circuit 11b also receives the frequency division ratio information 62 of a clock Ai, which is the other clock, and thereby masks clock pulses with consideration given to the relation with the clock Ai, i.e., the other clock. As a result, the clock frequency divider circuit 11b can generate clocks Sb which makes it possible to suppress the fluctuation in the current consumption and in which the power-supply noise and the EMI noise caused by the fluctuation is thereby small.

Further, the clock frequency divider circuit 11b masks, for any timings at which a clock pulse is masked when the frequency division ratio is small (the value of N/M or N/S is large), the clock pulse located at those timings when the frequency division ratio is larger (the value of N/M or N/S is smaller) to generate the clocks Sb.

A specific generation method of clocks Sb is explained with reference to FIG. 6. The clock frequency divider circuit 11b first assigns non-mask timings with the highest priority to the communication timings based on the communication timing information 36, and then preferentially assigns non-mask timings to timings at which no clock pulse exists in the clock Ai based on the other-clock frequency division ratio information 62. When a clock Sb is generated by dividing the frequency of the clock S at a frequency division ratio N/S (S and N are integers), it is necessary to assign non-mask timings to N cycles at each of which a clock pulse is output among the consecutive S cycles of the clock S. The assign process is performed in accordance with the following procedure.

(Step 1) Non-mask timings are assigned to cycles located at the communication timings. If non mask timings corresponding to all of N cycles can be assigned, the assign process is finished.

(Step 2) The remaining non-mask timings of N cycles are assigned to cycles which are located at timings other than the communication timings and which are cycles at which no clock pulse exists in the clock Ai among the cycles other than the cycles to which mask timings are assigned when the frequency division ratio is smaller (the value of N/M or N/S is larger). If non mask timings corresponding to all of N cycles can be assigned, the assign process is finished.

(Step 3) All the remaining non-mask timings of N cycles are assigned to cycles which are cycles other than the cycles to which non-mask timings are assigned in the steps 1 and 2 and which are cycles other than the cycles to which mask timings are assigned when the frequency division ratio is smaller (the value of N/M or N/S is larger), and the assign process is finished.

Therefore, in the case shown in FIG. 6, when the frequency division ratio of a clock Ai is 9/12 and the frequency division ratio of a clock Sb is 9/12, for example, non-mask timings corresponding to nine cycles at each of which a clock pulse is output are assigned to the timings T0 to T11 in the following manner.

Firstly, in a step 1, non-mask timings are assigned to three cycles corresponding to the communication timings T0, T4 and T8.

At this point, the number of non-mask timings that could be assigned is less than the nine cycles. Therefore, in the next step 2, the remaining non-mask timings are assigned to cycles T2, T6 and T10 which are located at timings other than the communication timings and which are cycles at which no clock pulse exists in the clock Ai among the seven cycles T1, T2, T3, T6, T7, T10 and T11 other than the two cycles T5 and T9 to which mask timings are assigned when the frequency division ratio is smaller (the value of N/M or N/S is larger), i.e., when the frequency division ratio is 11/12 or 10/12.

At this point, the number of non-mask timings that could be assigned is less than the nine cycles. Therefore, in the next step 3, non-mask timings are assigned to timings T3, T7 and T11.

With the above-described procedure, non-mask timings are assigned to the nine cycles corresponding to the timings T0, T2, T3, T4, T6, T7, T8, T10 and T11 among the timings T0 to T11.

Figure 7:
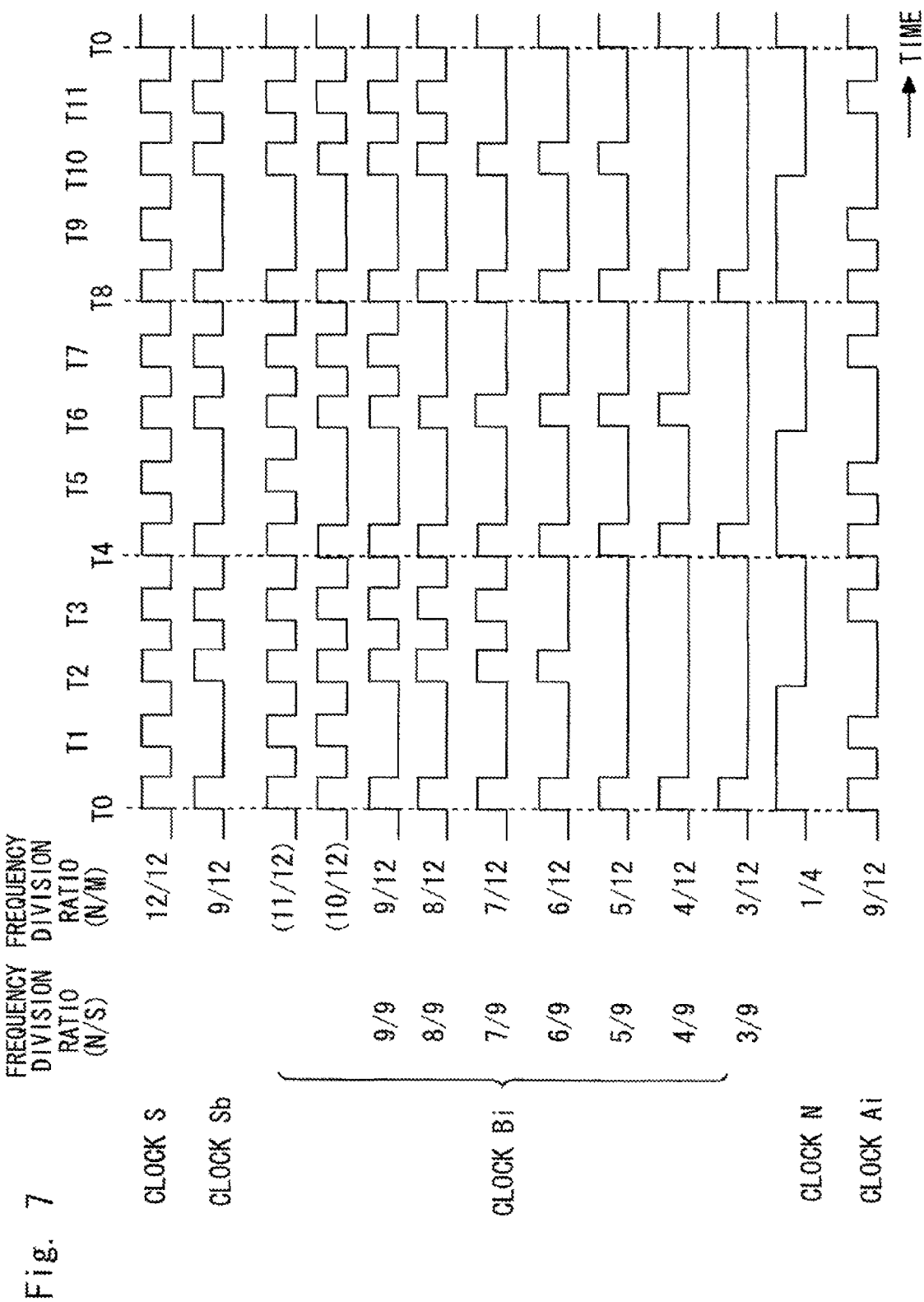
FIG. 7 is a timing chart of an example of a clock frequency division in accordance with a first exemplary embodiment of the present invention.

Next, an operation of a clock frequency divider circuit 11a in accordance with the first exemplary embodiment of the present invention is explained with reference to FIG. 7. FIG. 7 is a timing chart showing an operation of a clock frequency divider circuit 11a in accordance with the first exemplary embodiment of the present invention. The operation of the clock frequency divider circuit 11a is the same as that of the clock frequency divider circuit 11b shown in FIG. 6 except that its input clock is a clock Sb whose frequency is possibly divided by the clock frequency divider circuit 11b. Further, the timing at which a clock pulse is masked for the clock S is also the same.

A case where the frequency division ratio denominator M=12 and the frequency division ratio numerator N=9 to 3 for a frequency division ratio N/M given by the frequency division ratio setting 35 is explained hereinafter as an example. In this example, assume that the clock Sb, which is the input clock signal, is a clock obtained by dividing the frequency of the clock S at a frequency division ratio 9/12. Therefore, for the frequency division ratio S/M defining the frequency division ratio of the clock Sb that is given by the input clock frequency division ratio information 61, the input clock frequency division ratio numerator S=9 and the input clock frequency division ratio denominator M=12.

That is, it is an example case where the frequency of the clock Sb corresponding to a frequency division ratio 9/12 is divided at frequency division ratios 9/9 to 3/9 to generate clocks Bi. Therefore, it is an example case where clocks Bi equivalent to clock signals obtained by dividing the frequency of the clock S at frequency division ratios 9/12 to 3/12.

As described previously, for the frequency division ratio setting 35 of the clock frequency divider circuit 11b, the same value as that of frequency division ratio setting 35 in which the smallest frequency division ratio (the value of N/M is large) among all the clock frequency divider circuits 11a is set is supplied. Therefore, in this example, the clock frequency divider circuit 11a generates a clock Bi that is obtained by performing a frequency division at one of the frequency division ratios 9/12 to 3/12. FIG. 7 also shows the waveforms of clocks Bi corresponding to frequency division ratios 11/12 and 10/12 for the sake of comparison to those of FIG. 6. However, these frequency division ratios are never set in this example.

Similarly to FIG. 6, the frequency of the clock N is one fourth of the clock S in FIG. 7. That is, a case where the frequency division ratio of the clock N to the clock S is 1/4 (=3/12) and the clock N is in synchronization with the clock S is shown. Further, the clock Sb is generated by dividing the frequency of the clock S at a frequency division ratio 9/12. In this case, the phase relation between the clock N and the clock Sb, and between the clock N and the clocks Bi makes a full circle in twelve cycles of the clock S. In FIG. 7, the timings of the twelve cycles, in which the phase relation makes a full circle, are represented by "T0" to "T11". The circuits Ai and the circuits Bi perform data communication at the timings T0, T4 and T8 corresponding to the rising edge timings of the clock N.

In the frequency division example shown in FIG. 7, the clock Bi is generated by first assigning non-mask timings with the highest priority to the timings T0, T4 and T8, which are the communication timings, and then preferentially assigning non-mask timings to the timings T2, T6 and T10 at which no clock pulse exists in the clock Ai, i.e., in the other clock. Therefore, the mask control circuit 40 generates a mask signal 39 in which non-mask timings are first assigned with the highest priority to the timings T0, T4 and T8, which are the communication timings, and then non-mask timings are preferentially assigned to the timings T2, T6 and T10 at which no clock pulse exists in the clock Ai, i.e., in the other clock.

An operation of a clock frequency divider circuit 11 in accordance with this exemplary embodiment has been explained above by using an example case where the frequency division ratio of the clock Ai is 9/12. Even when the frequency division ratio of the clock Ai is a frequency division ratio other than 9/12, the clock frequency divider circuit 11 can also generate clocks Sb and clocks Bi by assigning non-mask timing in accordance with a similar procedure.

In particular, by generating clocks Ai by using the clock frequency divider circuit 10 in accordance with this exemplary embodiment and in accordance with the above-described non-mask timing assigning procedure of the clock frequency divider circuit 10 (e.g., FIGS. 4 and 5), it is possible to assign common non-mask timings for the clock Sb and clocks Bi for each frequency division ratio of the clocks Ai. For example, when the frequency division ratio of the clock Ai is a frequency division ratio other than 9/12, it is possible to assign non-mask timings at the same timings as the non-mask timings shown in FIGS. 6 and 7 in accordance with the non-mask timing assigning procedure of the clock frequency divider circuit 11.

In this case, the non-mask timing does not change depending on the frequency division ratio of the clock Ai. Therefore, there is an advantage that even when the frequency division ratio of the clock Ai is changed, the generation method of the clock Sb and clocks Bi does not need to be changed. Further, the input of the other-clock frequency division ratio information 62 to the clock frequency divider circuit 11 can be omitted.

Further, in a case where the circuit Bi operating by the clock Bi is a circuit that does not perform any communication or a circuit that performs communication using a certain communication method in which clock pulses are not necessarily required at communication timings such as a circuit using a special clock transfer circuit, non-mask timings does not need to be assigned with the highest priority to the communication timings and therefore the above-described step 1 may be omitted.

Figure 8:
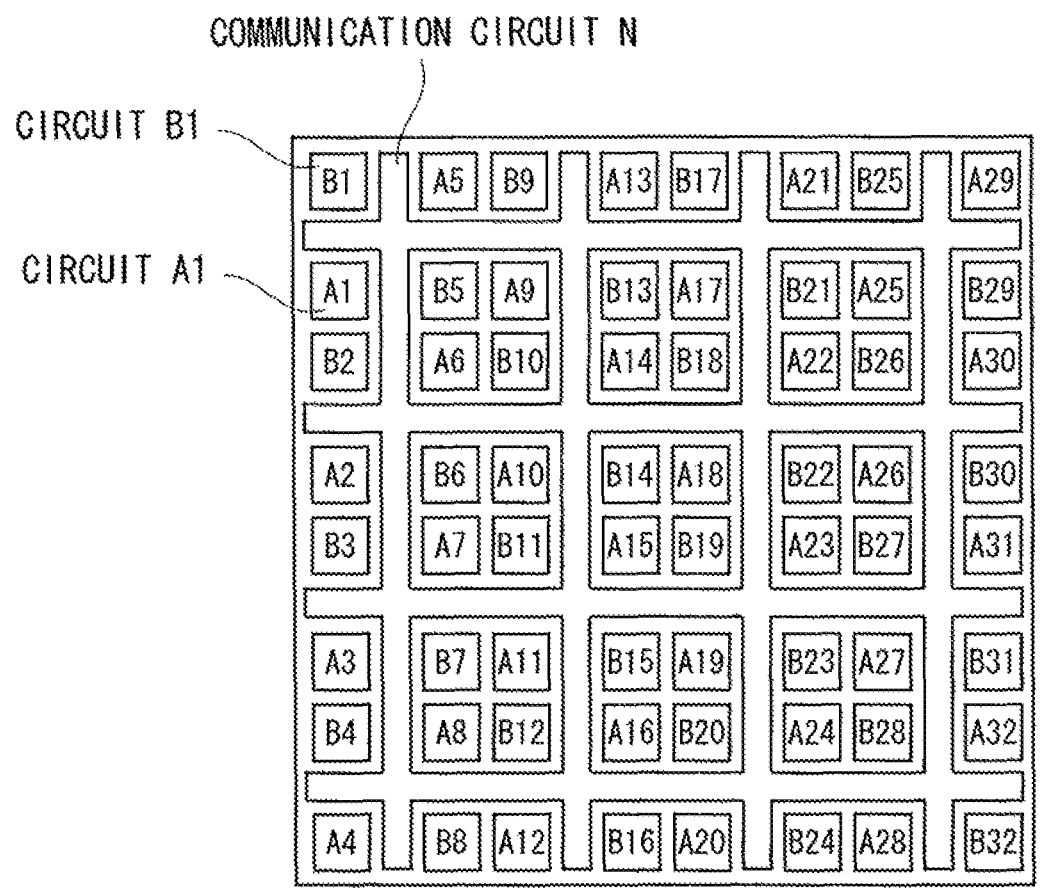
FIG. 8 is a layout diagram showing a layout example of a semiconductor integrated circuit in accordance with the present invention.

FIG. 8 shows a layout example of a semiconductor integrated circuit in accordance with this exemplary embodiment, and shows the layout positions of circuits Ai (i is integer and 1≤i≤32) operating by clocks Ai (i is integer and 1≤i≤32), circuits Bi (i is integer and 1≤i≤32) operating by clocks Bi (i is integer and 1≤i≤32), a communication circuit N operating by a clock N.

As described previously, the clocks Bi are generated by preferentially assigning non-mask timings to timings at which no clock pulse exists in the clocks Ai. Therefore, as shown in FIG. 8, by arranging the circuits Ai operating by the clocks Ai and the circuits Bi operating by the clocks Bi in such a manner that they are located adjacent to each other, the fluctuation in the current consumption of the circuits Ai and Bi can be suppressed. As a result, it is expected that the power-supply noise and EMI noise caused by the fluctuation will be lowered.

Specifically, for example, since a circuit B5 and a circuit A6 are located adjacent to each other, the clock B5 driving the circuit B5 may be generated by taking the clock A6 driving the circuit A6 into consideration. To that end, other-clock frequency division ratio information 62 indicating the frequency division ratio of the clock A6 may be input to the clock frequency divider circuit 11a that generates the clock B5. Similarly, other-clock frequency division ratio information 62 indicating the frequency division ratio of a clock A9 driving a circuit A9 may be input to the clock frequency divider circuit 11a that generates a clock B10 driving a circuit B10 located adjacent to the circuit A9.

As an alternative way, other-clock frequency division ratio information 62 indicating the larger one of the frequency division ratios of the clock A6 driving the circuit A6 and the clock A9 driving the circuit A9 may be input to the clock frequency divider circuit 11a that generates the clock B5 driving the circuit B5 located adjacent to the circuits A6 and A9. Similarly, other-clock frequency division ratio information 62 indicating the larger one of the frequency division ratios of the clock A6 driving the circuit A6 and the clock A9 driving the circuit A9 may be input to the clock frequency divider circuit 11a that generates the clock B11 driving the circuit B11 located adjacent to the circuits A6 and A9.

Further, in the case where the change of non-mask timings depending on the frequency division ratio of the clock Ai is made unnecessary by using common non-mask timings for the clocks Bi for each frequency division ratio of the clocks Ai in the clock frequency divider circuit 11, the input of the other-clock frequency division ratio information 62 to each clock frequency divider circuit 11a can be omitted and therefore the connections relating to the other-clock frequency division ratio information 62 can be also omitted.

As has been explained above, the clock frequency divider circuit in accordance with this exemplary embodiment performs, based on a frequency division ratio N/M given by the frequency division ratio setting 35, a rational-number frequency division on an input clock signal, whose frequency was divided at a frequency division ratio S/M given by the input clock frequency division ratio information 61, at a frequency division ratio N/S in order to generate an output clock signal that is equivalent to a clock signal obtained by dividing the frequency of the original clock signal, on which no frequency division was performed, at the frequency division ratio N/M. Therefore, it is possible to lower the frequency of the input clock signal in advance by dividing the frequency of the input clock signal.

Further, the clock frequency divider circuit in accordance with this exemplary embodiment generates clocks in such a manner that, for any timings at which a clock pulse is masked when the frequency division ratio is small, the clock pulse is always masked at those timings when the frequency division ratio is larger. Further, for the frequency division ratio setting of the clock frequency divider circuit 10b, the same value as that of frequency division ratio setting in which the smallest frequency division ratio (the value of N/M or N/S is large) among all the clock frequency divider circuits 10a is set is supplied. Therefore, the clock frequency divider circuit 10a can generate, from a clock Sa whose frequency is divided by the clock frequency divider circuit 10b, clocks Ai corresponding to frequency division ratios equal to and greater than frequency division ratio of the clock Sa. This is because, for any timings at which a clock pulse is masked in the clock Sa, the clock pulse is always masked at those timings in the clocks Ai, and for any timings at which a clock pulse is not masked in the clocks Ai, the clock pulse is never masked at those timings in the clock Sa.

In other words, the frequency of the clock Sa can be divided at a frequency division ratio equal to the smallest frequency division ratio (the value of N/M is large) among all the clocks Ai. Therefore, it is possible to lower the frequency of the clock signal (clock Sa), which is distributed by the clock tree circuit 21a. As a result, there is an advantageous effect that the power consumption of the clock tree circuit 21a can be reduced.

Similarly, for the frequency division ratio setting of the clock frequency divider circuit 11b, the same value as that of frequency division ratio setting in which the smallest frequency division ratio (the value of N/M or N/S is large) among all the clock frequency divider circuits 11a is set is supplied. Therefore, the clock frequency divider circuit 11a can generate, from a clock Sb whose frequency is divided by the clock frequency divider circuit 11b, clocks Bi corresponding to frequency division ratios equal to and greater than frequency division ratio of the clock Sb. This is because, for any timings at which a clock pulse is masked in the clock Sb, the clock pulse is always masked at those timings in the clocks Bi, and for any timings at which a clock pulse is not masked in the clocks Bi, the clock pulse is never masked at those timings in the clock Sb.

In other words, the frequency of the clock Sb can be divided at a frequency division ratio equal to the smallest frequency division ratio (the value of N/M is large) among all the clocks Bi. Therefore, it is possible to lower the frequency of the clock signal (clock Sb), which is distributed by the clock tree circuit 21b. As a result, there is an advantageous effect that the power consumption of the clock tree circuit 21b can be reduced.

Figure 15:
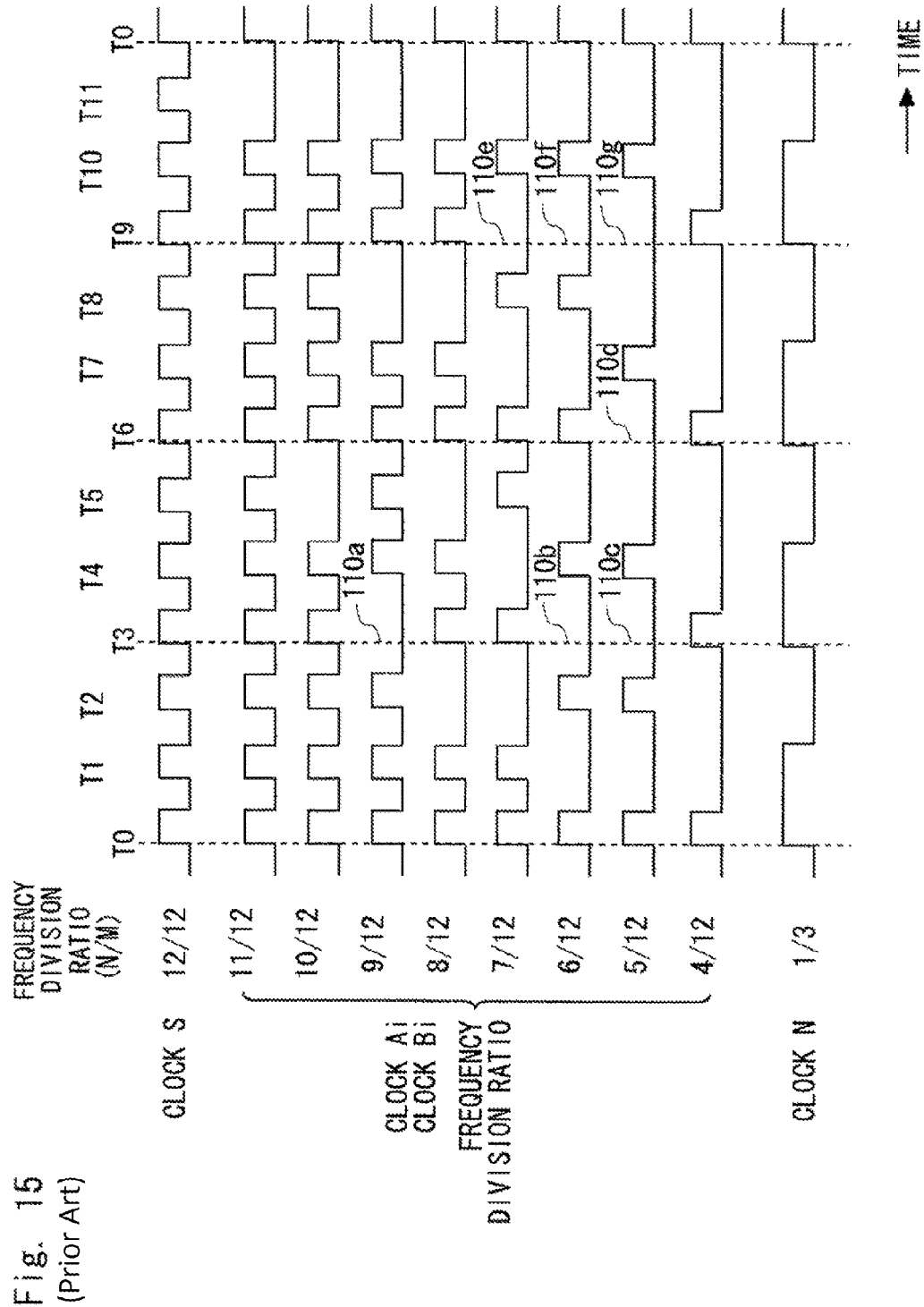
FIG. 15 is a timing chart of an example of a clock frequency division in related art.
Figure 16:
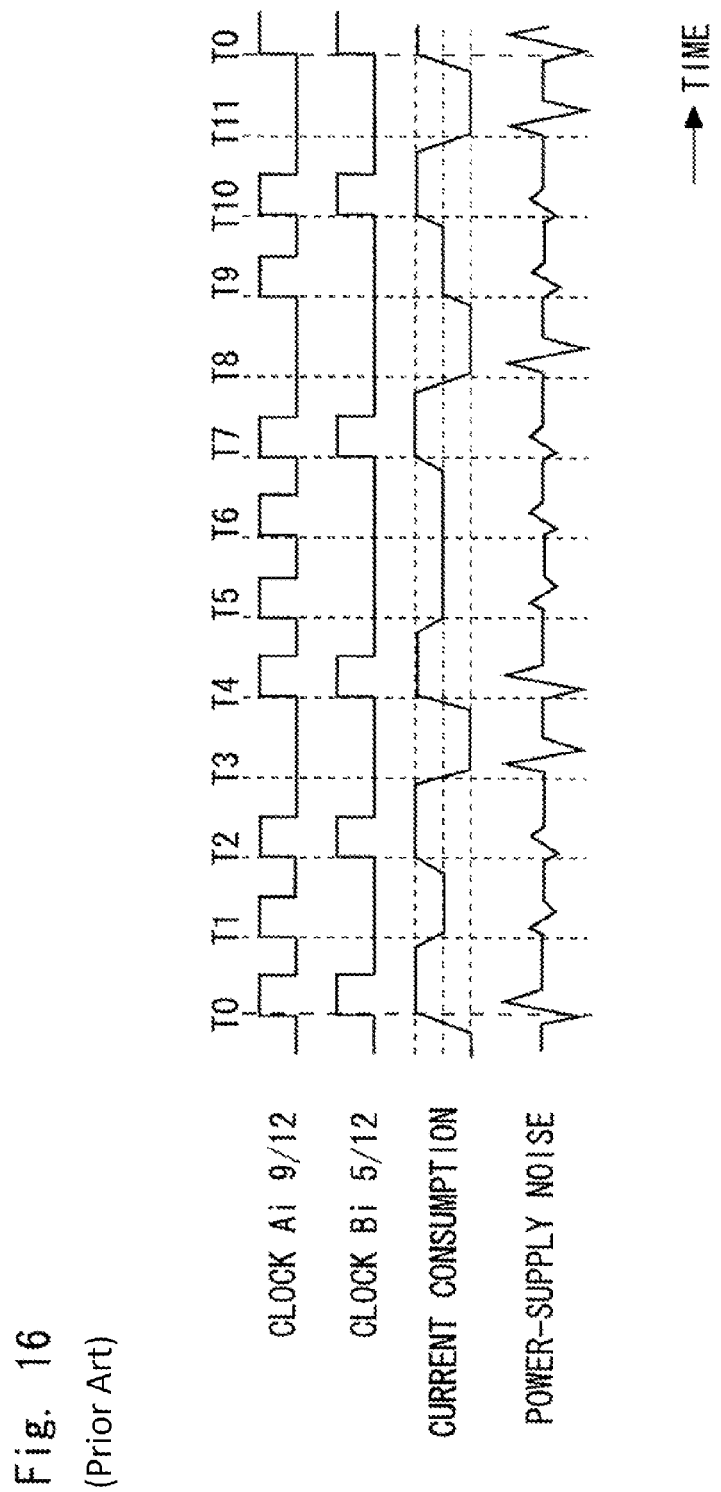
FIG. 16 is a timing chart of an example of a clock frequency division in related art.

In contrast to this, in a clock distribution method in which no consideration is given to the division of the frequency at the input end of the clock tree circuit as in the case of the related-art technique shown in FIG. 15, the frequency of the clock Sa cannot always be divided at a frequency division ratio equal to the smallest frequency division ratio among all the clocks Ai. Similarly, the frequency of the clock Sb cannot always be divided at a frequency division ratio equal to the smallest frequency division ratio among all the clocks Bi.

In the example shown in FIG. 15, for example, there are no clock pulses at the timings T3 and T8 in the clock. S corresponding to a frequency division ratio 9/12. Therefore, it is impossible to generate, from the clock corresponding to the frequency division ratio 9/12, clocks Ai and Bi corresponding to frequency division rations 8/12, 7/12, 6/12 and 4/12 in which clock pulses are necessary at the timings T3 and T8. Therefore, even if the smallest frequency division ratio is 9/12 among all the clocks Ai and Bi, the clock signal cannot always be divided at the frequency division ratio 9/12 at the input end of the clock tree circuit. Therefore, even if a clock frequency divider circuit is connected at the input end of the clock tree, the power consumption of the clock tree circuit cannot be sufficiently reduced.

Further, in this exemplary embodiment, the mask control circuit 30 generates a mask signal 39 and outputs the generated mask signal 39 to the mask circuit 50. In the mask signal, mask timings at each of which a clock pulse is masked are assigned. The mask timings are selected from any timings except for communication timings at which communication is performed between the circuits Ai and Bi and the communication circuit N based on the communication timing information 36 indicating the communication timings. In this way, clock pulses of the clock S are masked at the timings other than the communication timings at which communication is performed between the circuits Ai and Bi and the communication circuit N to generate the clocks Sa, clocks Ai, the clocks Sb, and the clocks Bi.

As a result, no clock pulse of the clocks Ai and Bi is masked at the communication timings, and therefore a clock pulse is always output at the communication timings in the clocks Ai and Bi. Accordingly, the circuits Ai and Bi can receive a signal output by the communication circuit N at an expected timing. Similarly, the circuits Ai and Bi can output a signal at a timing expected by the communication circuit N.

Therefore, according to a clock frequency divider circuit in accordance with this exemplary embodiment, it is possible to generate output clock signals (clocks Ai and Bi) that make it possible to perform data communication even with a circuit (communication circuit N) to be communicated that is operating by a clock signal having a different frequency (clock N) without impairing the communication performance. In this way, the need for a special clock transfer circuit and/or special timing design for communication with a circuit operating by a clock signal having a different frequency is eliminated, thus enabling a rational-number frequency division to be performed on a clock signal with a low power, a small size, and a low design cost.

Further, in this exemplary embodiment, mask timings at which clock pulses are masked are assigned to timings other than communication timings at which communication with the circuit to be communicated is performed according to the frequency division ratio setting 35 in the mask control circuit 30 and the mask control circuit 40. Therefore, for example, even when the frequency division ratio N/M is changed to any of the frequency division rations 11/12 to 3/12, clock pulses of the clock S, clock Sa, and clock Sb can be masked at timings other than the communication timings T0, T4 and T8. Therefore, even when the frequency division ratio is changed, it is unnecessary to change the clock N and/or the communication timing of the communication circuit N. Therefore, it is possible to cope with the change of the frequency division ratio in an extremely flexible manner.

Further, this exemplary embodiment prevents such a situation that no clock pulse exists in both of the clock Ai and clock Bi at a cycle immediately after a cycle at which a clock pulse exists in both of the clock Ai and clock Bi. That is, this exemplary embodiment prevents such a situation that a circuit Ai operating by the clock Ai and a circuit Bi operating by the clock Bi stop operating simultaneously at a cycle immediately after a cycle at which they have operated simultaneously.

Similarly, this exemplary embodiment also prevents such a situation that that a clock pulse exists in both of the clock Ai and clock Bi at a cycle immediately after a cycle at which no clock pulse exists in both of the clock Ai and clock Bi. That is, this exemplary embodiment prevents such a situation that a circuit Ai operating by the clock Ai and a circuit Bi operating by the clock Bi operate simultaneously at a cycle immediately after a cycle at which they stopped operating simultaneously.

Figure 9:
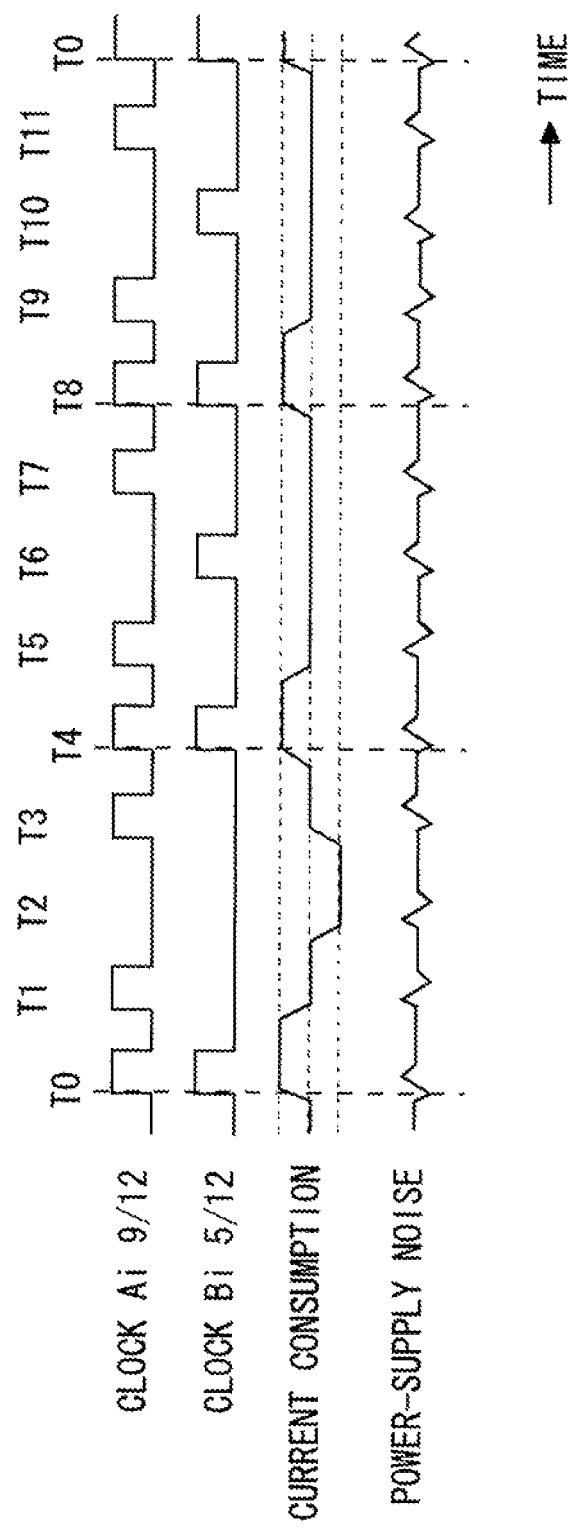
FIG. 9 is a timing chart of an example of a clock frequency division in accordance with a first exemplary embodiment of the present invention.

FIG. 9 is a timing chart showing an example of an operation of a clock frequency divider circuit in accordance with the first exemplary embodiment of the present invention. In this example, an example of a clock frequency division in a case where the frequency division ratios of the clocks Ai and Bi are 9/12 and 5/12 respectively and circuits Ai and Bi communicate with a communication circuit N at timings T0, T4 and T8 is shown.

For example, at a timing T4, a clock pulse exists in both the clock Ai and clock Bi and therefore both the circuit Ai and circuit Bi operate. As a result, the current consumption is large. Then, at a timing T5, which is a cycle immediately after the timing T4, a clock pulse exists in the clock Ai, and therefore the circuit Ai operates and consumes a certain amount of current. Further, at a timing T2, no clock pulse exists in both the clock Ai and clock Bi and therefore both the circuit Ai and circuit Bi do not operate. As a result, the current consumption is small. Then, at a timing T3, which is a cycle immediately after the timing T2, a clock pulse exists in the clock Ai, and therefore the circuit Ai operates and consumes a certain amount of current. As a result, the fluctuation in the current consumption in the circuits Ai and Bi is suppressed at the timings T5 and T3, thus lowering the power-supply noise and EMI noise caused by the fluctuation.

Further, although only the example case where the frequency division ratio of the clock Bi is 5/12 is shown in FIG. 9, clocks Bi corresponding to other frequency division ratios can be also generated in a similar manner as shown in FIGS. 6 and 7. Further, although only the example case where the frequency division ratio of the clock Ai is 9/12 is shown in FIGS. 6, 7 and 9, the clocks Bi can be also generated when the frequency division ratio of the clock Ai is a frequency division ratio other than 9/12 as shown in FIG. 5. Further, although the timings T0, T4 and T8 are used as the communication timings, the clocks Ai and Bi can be also generated when the other timings are selected as the communication timings.

Second Exemplary Embodiment

Next, a clock frequency divider circuit in accordance with a second exemplary embodiment of the present invention is explained with reference to FIGS. 10 and 11. In this exemplary embodiment of the present invention, specific examples of the mask circuit 50 and the mask control circuit 30 of the clock frequency divider circuit 10 as well as the mask circuit 50 and the mask control circuit 40 of the clock frequency divider circuit 11 in accordance with the first exemplary embodiment are explained.

Figure 10:
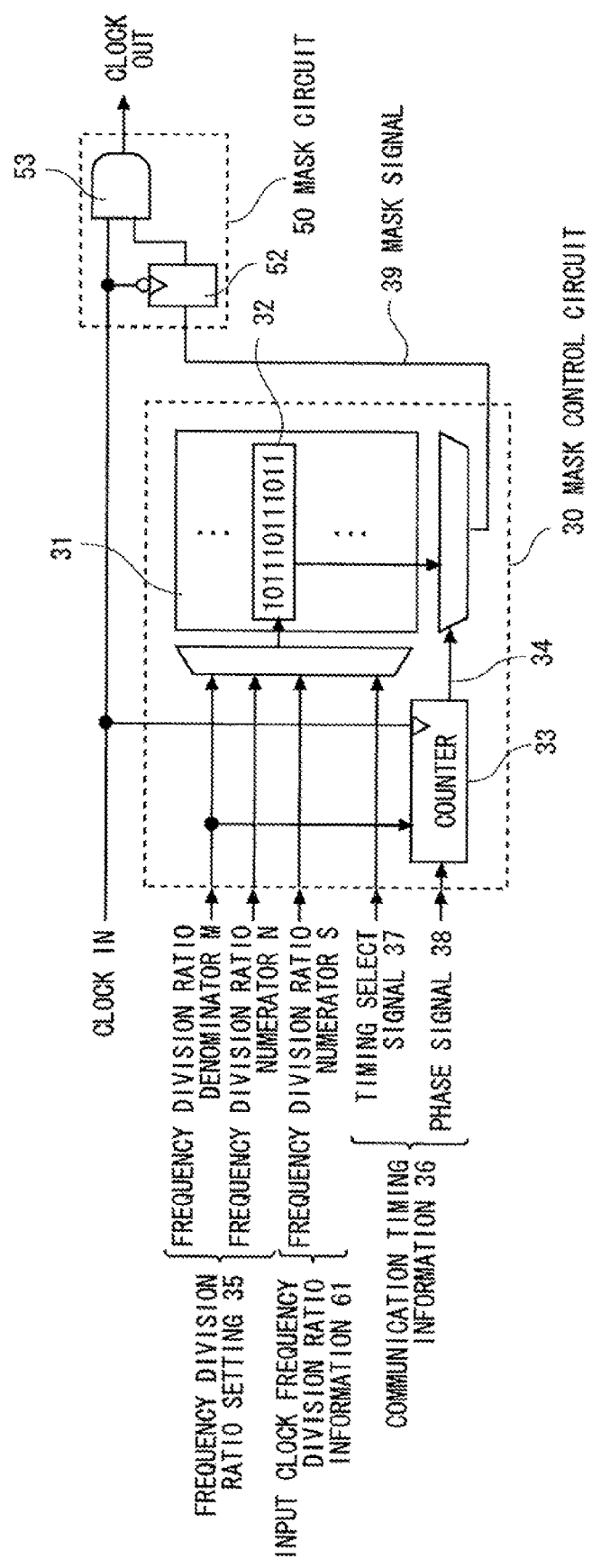
FIG. 10 is a configuration diagram of a clock frequency divider circuit in accordance with a second exemplary embodiment of the present invention.

FIG. 10 is a block diagram showing a configuration of a clock frequency divider circuit 10 in accordance with the second exemplary embodiment of the present invention. In FIG. 10, the mask circuit 50 has a function of selecting whether a clock IN pulse is masked or is output as the clock OUT without being masked by referring to an input mask signal 39. In this exemplary embodiment, this mask circuit 50 includes a latch circuit 52 and a gate circuit 53.

The latch circuit 52 has a function of restricting the transition of the mask signal 39 that is input to the gate circuit 53 to timings at which the value of the clock IN is "0" by latching the mask signal 39 at falling edge timings of the clock IN. The gate circuit 53 has a function of masking the clock IN based on the mask signal 39 latched by the latch circuit 52. When the value of the mask signal 39 is "0", the clock IN is masked. When the value of the mask signal 39 is "1", the clock IN is not masked.

The provision of the latch circuit 52 can prevent the occurrence of glitches in the clock OUT. Although the provision of the latch circuit 52 makes the timing design easier, the latch circuit 52 can be omitted if the occurrence of glitches is prevented by implementing precise timing design. Further, although an AND circuit is used as the gate circuit 53 to mask the clock IN in FIG. 5, the present invention is not limited to this configuration. An OR circuit or other circuits having a similar function may be also used.

The mask control circuit 30 counts the clock pulses of the clock IN based on the frequency division ratio setting 35, the communication timing information 36, and the input clock frequency division ratio information 61. By doing so, the mask control circuit 30 has a function of generating a counter value indicating the relative phase of the clock IN and the clock OUT, and generating and outputting a mask signal 39 in which mask timings are assigned based on the counter value.

In the second exemplary embodiment, this mask control circuit 30 includes a counter 33 and a table circuit 31. Further, the frequency division ratio setting 35 is composed of a frequency division ratio denominator M and a frequency division ratio numerator N each composed of parallel data consisting of a plurality of bits, and defines a frequency division ratio setting N/M.

Further, the communication timing information 36 is composed of a timing select signal 37 and a phase signal 38. The timing select signal 37 is a signal that is used to select a communication timing from timings included in a period in which the phase relation between the clock OUT (clock Sa or clocks Ai) and a clock signal (clock N), by which a circuit to be communicated with the circuit operating by the clock OUT is operating, makes a full circle. The timing select signal 37 is composed of parallel data consisting of a plurality of bits indicating a value specifying communication timings, and its value does not change unless the communication timing is changed. The phase signal 38 is a signal indicating the relative phase relation between the clock OUT and a clock signal by which a circuit to be communicated with the circuit operating by the clock OUT is operating (hereinafter expressed as "clock signal at the other end of communication").

The input clock frequency division ratio information 61 is composed of a frequency division ratio numerator S composed of parallel data consisting of a plurality of bits, and defines the frequency division ratio S/M of the input clock signal. The value of the denominator M is the same as that in the frequency division ratio setting 35. Therefore, the frequency division ratio denominator M of the frequency division ratio setting 35 is also used as the denominator M of the frequency division ratio S/M, so that the duplicated input is omitted.

The counter 33 has a function of counting the clock pulses of the clock IN. Further, when the phase relation between the clock OUT and the clock signal at the other end of communication makes a full circle, the counter 33 resets the counter value to the initial value in synchronization with the timing of the phase signal 38 and outputs a counter value 34 indicating the relative phase of the clock OUT and the clock signal at the other end of communication. In this way, the number of cycles in which the phase relation between the clock OUT and the clock signal at the other end of communication makes a, full circle is output from the counter 33 as a counter value 34.

The table circuit 31 has a function of holding table data 32 in table format in advance. In the table data 32, the necessity/non-necessity of masking is indicated for each combination of the counter value 34, the frequency division ratio denominator M and the frequency division ratio numerator N, i.e., the frequency division ratio setting 35, the frequency division ratio numerator S, i.e., the input clock frequency division ratio information 61, and the timing select signal 37. Further, the table circuit 31 also has a function of selecting table data according to the combination of these input values and outputting the selected table data as a mask signal 39. In this way, a mask signal 39 that is used to control whether or not the clock pulse of the clock IN is masked in the mask circuit 50 according to the frequency division ratio denominator M, the frequency division ratio numerator N, the counter value 34, the frequency division ratio numerator S, and the timing select signal 37 is output from the table circuit 31 for each clock pulse of the clock IN.

Figure 11:
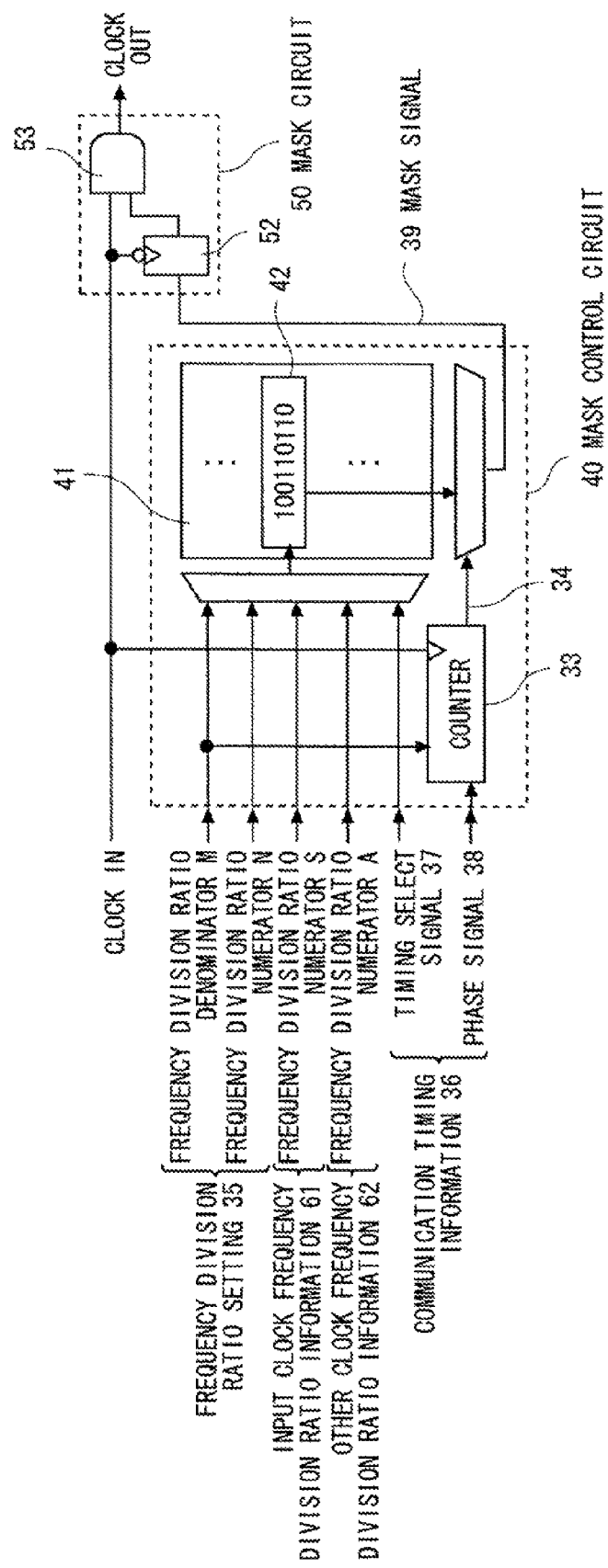
FIG. 11 is a configuration diagram of a clock frequency divider circuit in accordance with a second exemplary embodiment of the present invention.

FIG. 11 is a block diagram showing a configuration of a clock frequency divider circuit 11 in accordance with the second exemplary embodiment of the present invention. The same components as those in FIG. 10 are denoted by the same signs, and their detailed explanation is omitted.

The mask control circuit 40 counts the clock pulses of the clock IN based on the frequency division ratio setting 35, the communication timing information 36, the input clock frequency division ratio information 61, and the other-clock frequency division ratio information 62. By doing so, the mask control circuit 40 has a function of generating a counter value indicating the relative phase of the clock IN and the clock OUT, and generating and outputting a mask signal 39 in which mask timings are assigned based on the counter value.

The other-clock frequency division ratio information 62 is composed of a frequency division ratio denominator A composed of parallel data consisting of a plurality of bits, and defines a frequency division ratio A/M of other clock signals (e.g., clock Ai). The value of the denominator M is the same as that in the frequency division ratio setting 35. Therefore, the frequency division ratio denominator M of the frequency division ratio setting 35 is also used as the denominator M of the frequency division ratio A/M, so that the duplicated input is omitted.

The table circuit 41 has a function of holding table data 42 in table format in advance. In the table data 42, the necessity/non-necessity of masking is indicated for each combination of the counter value 34, the frequency division ratio denominator M and the frequency division ratio numerator N, i.e., the frequency division ratio setting 35, the frequency division ratio numerator S, i.e., the input clock frequency division ratio information 61, the frequency division ratio numerator A, i.e., the other-clock frequency division ratio information 62, and the timing select signal 37. Further, the table circuit 31 also has a function of selecting table data according to the combination of these input values and outputting the selected table data as a mask signal 39. In this way, a mask signal 39 that is used to control whether or not the clock pulse of the clock IN is masked in the mask circuit 50 according to the frequency division ratio denominator M, the frequency division ratio numerator N, the counter value 34, the frequency division ratio numerator S, the frequency division ratio numerator A, and the timing select signal 37 is output from the table circuit 31 for each clock pulse of the clock IN.

Next, an operation of a clock frequency divider circuit 11 in accordance with the second exemplary embodiment of the present invention is explained with reference to FIGS. 12 and 13.

Firstly, a clock frequency divider circuit 11b in accordance with the second exemplary embodiment of the present invention is explained with reference to FIG. 12. FIG. 12 is a timing chart showing an operation of the clock frequency divider circuit 11b in accordance with the second exemplary embodiment of the present invention.

A case where a clock Sb corresponding to a frequency division ratio 9/12 is generated from a clock S is explained hereinafter. Assume that the circuits Bi and the communication circuit N perform data communication at all the rising edge timings of the clock N. Further, the clock N is in synchronization with the clock S and its frequency division ratio is one fourth of the clock S. That is, the circuits Bi and the communication circuit N communicate with each other at timings T0, T4 and T8. Assume also that the frequency division ratio of the clock Ai, which is the other clock signal, is 9/12.

The timing select signal 37 is a signal indicating that the communication timing is timings T0, T4 and T8, and its value does not change unless the communication timing is changed.

The phase signal 38 is a signal that becomes "1" at any one cycle of the rising edge timings of the clock N in a period in which the phase relation between the clock Sb and the clock N makes a full circle, and becomes "0" at all the other cycles. In the case of FIG. 6, the phase signal 38 becomes "1" at a timing T0, which is one of the twelve cycles of the clock S in which the phase relation makes a full circle.

The clock S, which is an input clock signal, is a clock signal on which no frequency division was performed. Therefore, the frequency division ratio is one, that is, S/M=12/12. Therefore, a value 12 is set to the frequency division ratio numerator S.

The frequency division ratio A/M of the clock Ai, which is the other clock signal, is 9/12. Therefore, a value 9 is set to the frequency division ratio numerator A.

The counter 33 resets the counter value to the initial value at a timing at which the phase signal 38 becomes "1". After that, the twelve cycles in which the phase relation between the clock Sb and the clock N makes a full circle is repeated and the clock pulses of the clock S is counted. In this way, a counter value 34 indicating the phase relation between the clock Sb and the clock N is output from the counter 33.

Figure 12:
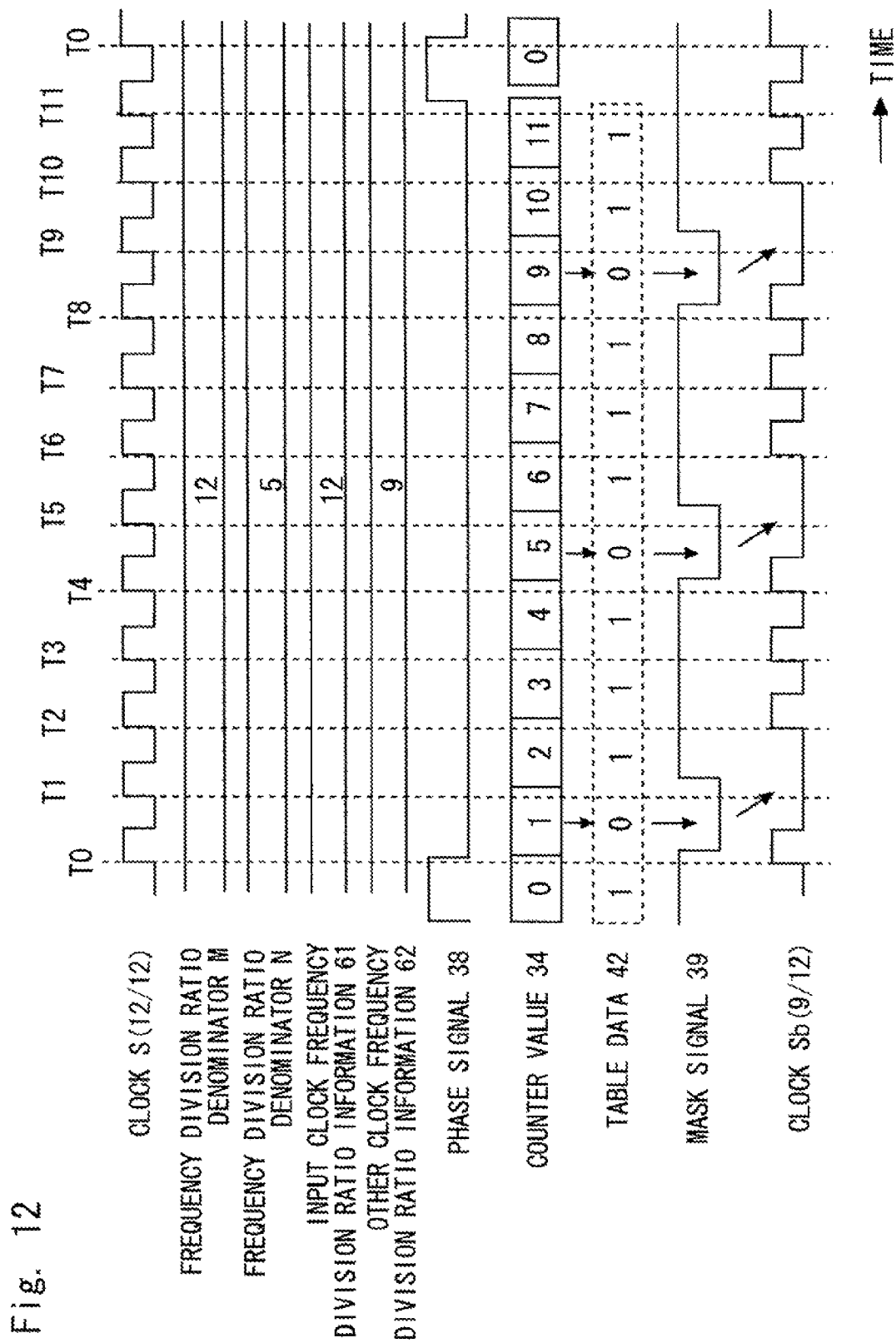
FIG. 12 is a timing chart showing an operation of a clock frequency divider circuit in accordance with a second exemplary embodiment of the present invention.

In FIG. 12, the timings at which the counter value 34 takes on values "0" to "11" correspond to the timings T0 to T11 respectively. That is, the counter value 34 becomes "0" at the timing T0, becomes "1" at the timing T1, . . . , and becomes "11" at the timing T11. After that, the counter value 34 becomes "0" again at the timing T0.

In the table data 42 of the table circuit 41, "0" is set when the pulse of the clock S is to be masked at the next cycle and "1" is set when the pulse is not to be masked at the next cycle for each combination of the frequency division ratio denominator M, the frequency division ratio numerator N, the counter value 34, the frequency division ratio numerator S, the frequency division ratio numerator A, and the timing select signal 37. Therefore, a value of the table data 42 according to the combination of the frequency division ratio denominator M, the frequency division ratio numerator N, the counter value 34, the frequency division ratio numerator S, the frequency division ratio numerator A, and the timing select signal 37, which are input at each timing, is output as a mask signal 39.

In the case of FIG. 12, table data 42 in which mask timings are assigned to combinations corresponding to timings T1, T5 and T9, which are timings other than the communication timings of data communication between the circuits Bi and the communication circuit N, among the timings T0 to T11 is set in advance in the table circuit 41. Further, non-mask timings are assigned to combinations corresponding to the other timings, i.e., timings T0, T2, T3, T4, T6, T7, T8, T10 and T11.

In this way, when the counter value is "1", "5" or "9", for example, the value "0" indicating a mask timing is output as the table data 42 from the table circuit 41 as a mask signal 39. Further, for all the other cases, the value "1" indicating a non-mask timing is output as the table data 42 from the table circuit 41 as a mask signal 39. The mask circuit 50 refers to this mask signal 39 and thereby masks pulses of the clock S at the timings T1, T5 and T9. Further, the mask circuit 50 outputs pulses of the clock S as the clock Sb without masking them at the other timings.

Therefore, clock pulses of the clock S are always output as the clock Sb without being masked at the timings T0, T4 and T8, which are the communication timings, among the timings T0 to T11. Meanwhile, some of the clock pulses at the timings other than the communication timings, i.e., clock pulses at timings T1, T5 and T9 in this example are masked and thereby are not output as the clock Sb.

In FIG. 12, although a generation example in a specific case where: the frequency division ratio of the clock Sb is 9/12; the frequency of the clock N is one fourth of the clock S; and communication is performed at all the rising edge timings of the clock N is shown, the operation may be also performed in a similar manner in other cases. By appropriately setting the value of the table data 42 for each combination of the communication timing information 36, the frequency division ratio setting 35, the input clock frequency division ratio information 61, the other-clock frequency division ratio information 62, and the counter value 34 indicating the relative phase relation between the clock Sb and the clock N, it is possible to realize an arbitrary rational-number frequency division by preventing clock pulses located at the communication timings from being masked and masking some of clock pulses located at the timings other then the communication timings.

Further, although the frequency division ratio denominator M, the frequency division ratio numerator N, the frequency division ratio numerator S, the frequency division ratio numerator A, and the like, which are input to the mask control circuit 40, are fixed values in FIG. 12, they may be changed as appropriate during the operation within the range in which the table circuit 41 holds the table data 42 corresponding to these values.

next, a clock frequency divider circuit 11a in accordance with the second exemplary embodiment of the present invention is explained with reference to FIG. 13. FIG. 13 is a timing chart showing an operation of the clock frequency divider circuit 11a in accordance with the second exemplary embodiment of the present invention.

A case where a clock Bi corresponding to a frequency division ratio 5/12 is generated from a clock Sb corresponding to a frequency division ratio 9/12 generated by the clock frequency divider circuit 11b is explained hereinafter. Assume that the circuit Bi and the communication circuit N perform data communication at all the rising edge timings of the clock N. Further, the clock N is in synchronization with the clock S and its frequency division ratio is one fourth of the clock S. That is, the circuit Bi and the communication circuit N communicate with each other at timings T0, T4 and T8. Assume also that the frequency division ratio of the clock Ai, which is the other clock signal, is 9/12.

The timing select signal 37 is a signal indicating that the communication timing is timings T0, T4 and T8, and its value does not change unless the communication timing is changed.

The phase signal 38 is a signal that becomes "1" at any one cycle of the rising edge timings of the clock N in a period in which the phase relation of the clock Ai and the clock N makes a full circle, and becomes "0" at all the other cycles. In the case of FIG. 7, the phase signal 38 becomes "1" at a timing T0, which is one of the twelve cycles of the clock S in which the phase relation makes a full circle.

Since the frequency division ratio S/M of the clock Sb, which is an input clock signal, is 9/12, a value "9" is set to the frequency division ratio numerator S.

The frequency division ratio A/M of the clock Ai, which is the other clock signal, is 9/12. Therefore, a value "9" is set to the frequency division ratio numerator A.

The counter 33 resets the counter value to the initial value at a timing at which the phase signal 38 becomes "1". After that, the twelve cycles in which the phase relation between the clock Bi and the clock N makes a full circle, which corresponds to the nine cycles of the clock Sb, is repeated and the clock pulses of the clock Sb is counted. In this way, a counter value 34 indicating the phase relation of the clock Bi and the clock N is output from the counter 33. Since the counter 33 operates by the clock Sb, the counter value 34 takes on values "0" to "8" corresponding to the nine cycles of the clock Sb.

Figure 13:
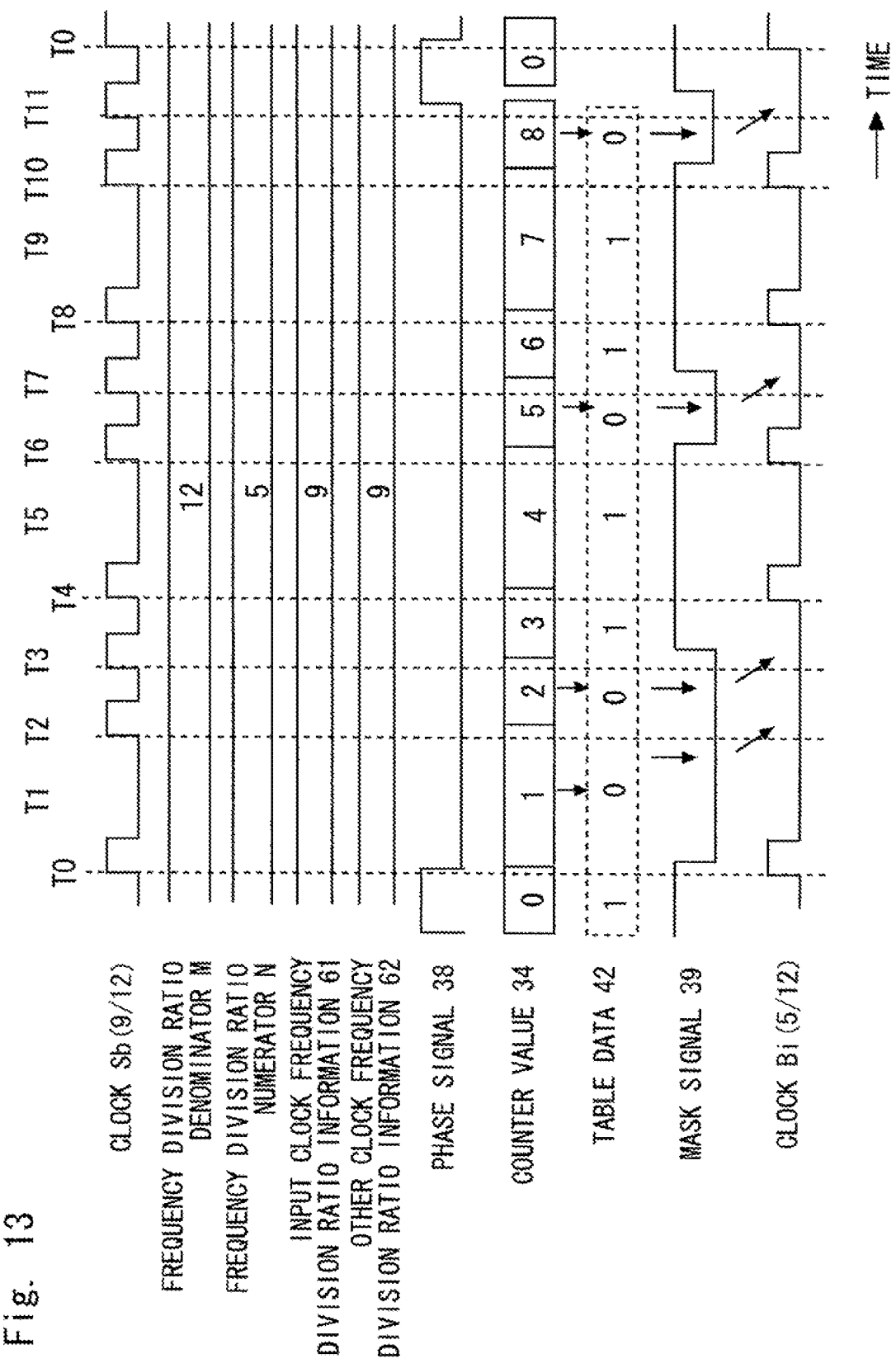
FIG. 13 is a timing chart showing an operation of a clock frequency divider circuit in accordance with a second exemplary embodiment of the present invention.

In FIG. 13, the timings at which the counter value 34 takes on values "0" to "8" correspond to the timings T0 to T11. That is, the counter value 34 becomes "0" at the timing T0, "1" at the timings T1 and T2, "2" at the timing T3, "3" at the timing T4, "4" at the timings T5 and T6, "5" at the timing T7, "6" at the timing T8, "7" at the timings T9 and T10, and "8" at the timing T11. After that, the counter value 34 becomes "0" again at the timing T0.

In the table data 42 of the table circuit 41, "0" is set when the pulse of the clock Sb is to be masked at the next cycle and "1" is set when the pulse is not to be masked at the next cycle for each combination of the frequency division ratio denominator M, the frequency division ratio numerator N, the counter value 34, the frequency division ratio numerator S, the frequency division ratio numerator A, and the timing select signal 37. Therefore, a value of the table data 42 according to the combination of the frequency division ratio denominator M, the frequency division ratio numerator N, the counter value 34, the frequency division ratio numerator S, the frequency division ratio numerator A, and the timing select signal 37, which are input at each timing, is output as a mask signal 39.

In the case of FIG. 13, table data 42 in which mask timings are assigned to combinations corresponding to timings T1, T2, T3, 15, T7, T9 and T11, which are timings other than the communication timings of data communication between the circuits Bi and the communication circuit N, among the timings T0 to T11 is set in advance in the table circuit 41. Further, non-mask timings are assigned to combinations corresponding to the other timings, i.e., timings T0, T4, T6, T8 and T10.

In this way, when the counter value is "1", "2", "5" or "8", for example, the value "0" indicating a mask timing is output as the table data 42 from the table circuit 41 as a mask signal 39. Further, for all the other cases, the value "1" indicating a non-mask timing is output as the table data 42 from the table circuit 41 as a mask signal 39. The mask circuit 50 refers to this mask signal 39 and thereby masks pulses of the clock Sb at the timings T1, T2, T3, T5, T7, T9 and T11. Further, the mask circuit 50 outputs pulses of the clock Sb as the clock Bi without masking them at the other timings.

Therefore, clock pulses of the clock Sb are always output as the clock Bi without being masked at the timings T0, T4 and T8, which are the communication timings, among the timings T0 to T11. Meanwhile, some of the clock pulses at the timings other than the communication timings, i.e., clock pulses at timings T1, T2, T3, T5, T7, T9 and T11 in this example are masked and thereby are not output as the clock Bi.

In FIG. 13, although a generation example in a case where: the frequency division ratio of the clock Sb is 9/12; the frequency division ratio of the clock Bi is 5/12; the frequency of the clock N is one fourth of the clock S; and communication is performed at all the rising edge timings of the clock N is shown, the operation may be also performed in a similar manner in other cases. By appropriately setting the value of the table data 32 for each combination of the communication timing information 36, the frequency division ratio setting 35, the input clock frequency division ratio information 61, and the counter value 34 indicating the relative phase relation between the clock Ai and the clock N, it is possible to realize an arbitrary rational-number frequency division by preventing clock pulses located at the communication timings from being masked and masking some of clock pulses located at the timings other then the communication timings.

Further, although the frequency division ratio denominator M, the frequency division ratio numerator N, the frequency division ratio numerator S, the frequency division ratio numerator A, and the like, which are input to the mask control circuit 40, are fixed values in FIG. 7, they may be changed as appropriate during the operation within the range in which the table circuit 41 holds the table data 42 corresponding to these values.

An operation of a clock frequency divider circuit 11 in accordance with the second exemplary embodiment of the present invention has been explained above with reference to FIGS. 12 and 13. The table circuit 31 of the clock frequency divider circuit 10 in accordance with the second exemplary embodiment of the present invention is different from the table circuit 41 of the clock frequency divider circuit 11 only in that the table circuit 41 holds table data 42 for each combination of the frequency division ratio denominator M, the frequency division ratio numerator N, the counter value 34, the frequency division ratio numerator S, the frequency division ratio numerator A, and the timing select signal 37, and its value is output as a mask signal 39, whereas the table circuit 31 holds table data 32 for each combination of the frequency division ratio denominator M, the frequency division ratio numerator N, the counter value 34, the frequency division ratio numerator S, and the timing select signal 37, and its value is output as a mask signal 39. Therefore, the operation of the clock frequency divider circuit 10 in accordance with the second exemplary embodiment of the present invention is similar to that of the clock frequency divider circuit 11.

As has been described above, in this exemplary embodiment, the clock pulses of the input clock signal is counted by the counter in the mask control circuit, and the counter value is reset to the initial value at the time when the phase relation between the output clock signal and the clock signal that drives a circuit to be communicated with the circuit operating by the output clock signal makes a full circle. By doing so, a count value indicating the relative phase of the communication timing with respect to the input clock signal is generated, and a mask signal in which mask timings are assigned based on this count value is generated. Therefore, the relative phase of the communication timing with respect to the input clock signal can be derived by using a very simple circuit configuration, i.e., by using a counter, and therefore it is possible to accurately assign mask timings at timings other than the communication timing.

Further, in this exemplary embodiment, table data indicating the necessity/non-necessity of masking for each combination of at least the communication timing information, the frequency division ratio setting, the input clock frequency division ratio information, and the count value is held in advance in the table circuit in the mask control circuit, and table data that is output from the table circuit according to the input combination is output as a mask signal. By doing so, it is possible to accurately assign desired mask timings at timings other than the communication timing according to the relative phase of the communication timing with respect to the input clock signal by using a very simple circuit configuration, i.e., by using a table circuit.

Further, in this exemplary embodiment, table data indicating the necessity/non-necessity of masking for each combination of at least the communication timing information, the frequency division ratio setting, the input clock frequency division ratio information, the other-clock frequency division ratio information, and the count value is held in advance in the table circuit in the mask control circuit, and table data that is output from the table circuit according to the input combination is output as a mask signal. By doing so, it is possible to assign non-mask timings with the highest priority to communication timings of the circuits Ai and Bi, and then preferentially assign non-mask timings to timings at which the circuit Ai does not operate by using a very simple circuit configuration, i.e., by using a table circuit.

Further, in this exemplary embodiment, table data indicating the necessity/non-necessity of masking for each combination of at least the communication timing information, the frequency division ratio setting, the input clock frequency division ratio information, and the count value is held in advance in the table circuit in the mask control circuit, and table data that is output from the table circuit according to the input combination is output as a mask signal. By doing so, it is possible to accurately assign desired mask timings at timings other than the communication timing according to the relative phase of the communication timing with respect to the input clock signal even when the input clock signal is a clock signal on which a frequency division was performed in advance.

Further, although the frequency division ratio setting 35 that is input by the mask control circuit 30 is composed of the frequency division ratio denominator M indicating the value of the denominator of the frequency division ratio and the frequency division ratio numerator N indicating the value of the numerator of the frequency division ratio in this exemplary embodiment, other formats capable of setting the frequency division ratio may be also used. Similarly, although the communication timing information that is input by the mask control circuit 30 is composed of the timing select signal 37 used to select the communication timing and the phase signal 38 indicating the phase relation between the output clock signal and the clock signal at the other end of communication in the second exemplary embodiment, other formats capable of designating the communication timing may be also used. Further, signals that are not indispensable for the setting of the frequency division ratio and the designation of the communication timing may be omitted as appropriate. In the case where the communication timing is located only at a specific timing, for example, the table data 32 does not necessarily have to be prepared for each value of the timing select signal 37, and therefore the timing select signal 37 can be omitted.

Further, since the clock frequency divider circuit 10 in accordance with this exemplary embodiment is entirely composed of digital logic circuits to select whether the clock IN is masked or not and thereby to realize a rational-number frequency division, its power consumption and layout size are small. Further, since the clock frequency divider circuit 10 does not require any analog circuit and any special design, its design/testing cost is low.

INDUSTRIAL APPLICABILITY

The present invention can be widely applied to semiconductor circuits in which clock signals having different frequencies are distributed to a plurality of circuit blocks, and to fields of electronic devices using such semiconductor circuits.

REFERENCE SIGNS LIST 10, 10a, 10b CLOCK FREQUENCY DIVIDER CIRCUIT
11, 11a, 11b CLOCK FREQUENCY DIVIDER CIRCUIT
20 CLOCK TREE CIRCUIT
21 CLOCK TREE CIRCUIT
21a, 21b PARTIAL CLOCK TREE CIRCUIT
22 CLOCK BUFFER
30 MASK CONTROL CIRCUIT
31 TABLE CIRCUIT
32 TABLE DATA
33 COUNTER
34 COUNTER VALUE
35 FREQUENCY DIVISION RATIO SETTING
36 COMMUNICATION TIMING INFORMATION
37 TIMING SELECT SIGNAL
38 PHASE SIGNAL
39 MASK SIGNAL
40 MASK CONTROL CIRCUIT
41 TABLE CIRCUIT
42 TABLE DATA
50 MASK CIRCUIT
52 LATCH CIRCUIT
53 GATE CIRCUIT
61 INPUT CLOCK FREQUENCY DIVISION RATIO INFORMATION
100 CLOCK FREQUENCY DIVIDER CIRCUIT

The invention claimed is:

1. A clock frequency divider circuit that generates an output clock signal obtained by dividing a frequency of an input clock signal into N/S (N is positive integer and S is positive integer greater than N) by masking (S-N) clock pulses from S clock pulses of the input clock signal based on a frequency division ratio defined as N/S, the clock frequency divider circuit comprising:
  a mask control circuit that generates a mask signal in which a non-mask timing is preferentially assigned to a predetermined clock pulse among S clock pulses of the input clock signal, the predetermined clock pulse existing at a timing at which no clock pulse exists in a clock signal used in a circuit other than a target circuit, the target circuit using the output clock signal; and
  a mask circuit that generates the output clock signal by masking a clock pulse of the input clock signal according to the mask signal generated by the mask control circuit.

2. The clock frequency divider circuit according to claim 1, wherein the mask control circuit further generates a mask signal used to preferentially mask a clock pulse at a timing other than a communication timing of data communication performed by the target circuit using the output clock signal.

3. The clock frequency divider circuit according to claim 1, wherein, when the frequency division ratio is larger, the control circuit generates the mask signal that masks the clock pulse that is determined to be masked when the frequency division ratio is small.

4. The clock frequency divider circuit according to claim 1, wherein the mask control circuit comprises a table circuit that holds table data indicating necessity/non-necessity of masking for each combination of at least a frequency division ratio denominator S and a frequency division ratio numerator N defining the frequency division ratio in advance, and outputs table data output from the table circuit according to the input combination as the mask signal.

5. The clock frequency divider circuit according to claim 4, wherein the table circuit holds table data indicating necessity/non-necessity of masking for each combination of the frequency division ratio denominator S, the frequency division ratio numerator N, and an additional frequency division ratio denominator M of S/M (S is positive integer and M is positive integer greater than S) defining a frequency division ratio of the input clock signal in advance.

6. The clock frequency divider circuit according to claim 1, wherein the control circuit generates a count value indicating a relative phase of the communication timing with respect to the input clock signal by counting clock pulses of the input clock signal and, when the count value reaches a frequency division ratio denominator S, resetting the count value to an initial value, and generates the mask signal based on this count value.

7. The clock frequency divider circuit according to claim 4, wherein the table circuit holds table data indicating necessity/non-necessity of masking for each combination of the frequency division ratio denominator S, the frequency division ratio numerator N, the frequency division ratio denominator M, an additional other clock information indicating a pulse timing of a clock signal used in the other circuit, and the count value in advance, and outputs table data output from the table circuit according to the input combination as the control signal.

8. A clock frequency division method to generate an output clock signal obtained by dividing a frequency of an input clock signal into N/S (N is positive integer and S is positive integer greater than N) by masking (S-N) clock pulses from S clock pulses of the input clock signal based on a frequency division ratio defined as N/S, the clock frequency division method comprising:

determining that a predetermined clock pulse is preferentially left unmasked among S clock pulses of the input clock signal, the predetermined clock pulse existing at a timing at which no clock pulse exists in a clock signal used in a circuit other than a target circuit, the target circuit using the output clock signal; and generating the output clock signal by masking a clock pulse other than the determined clock pulse.

9. The clock frequency division method according to claim 8, wherein when determining that the clock pulse is preferentially left unmasked, a clock pulse at a timing other than a communication timing of data communication performed by a target circuit using the output clock signal is preferentially masked.

10. The clock frequency division method according to claim 9, wherein any clock pulse, which is determined as a clock pulse to be masked when the frequency division ratio is small, is included into clock pulses to be masked when the frequency division ratio is larger.

* * * * *